United States Patent
Kuo et al.

(10) Patent No.: US 11,121,106 B2
(45) Date of Patent: Sep. 14, 2021

(54) INTEGRATED CIRCUIT PACKAGE AND METHOD

(71) Applicant: Taiwan Semiconductor Manufacturing Company, Ltd., Hsinchu (TW)

(72) Inventors: Hung-Jui Kuo, Hsinchu (TW); Chia-Wei Wang, Hsinchu (TW); Hui-Jung Tsai, Hsinchu (TW); Yu-Tzu Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 7 days.

(21) Appl. No.: 16/670,277

(22) Filed: Oct. 31, 2019

(65) Prior Publication Data

US 2021/0134749 A1 May 6, 2021

(51) Int. Cl.
*H01L 23/00* (2006.01)
*H01L 21/683* (2006.01)
(Continued)

(52) U.S. Cl.
CPC .......... *H01L 24/11* (2013.01); *H01L 21/4853* (2013.01); *H01L 21/4857* (2013.01);
(Continued)

(58) Field of Classification Search
CPC ... H01L 2924/014; H01L 24/20; H01L 24/11; H01L 2224/1146; H01L 2224/11614; H01L 2224/117; H01L 2224/11849; H01L 2224/13584; H01L 2224/13624; H01L 2224/13639; H01L 2224/13644; H01L 2224/13647; H01L 2224/13655; H01L 2224/13666; H01L 2224/13684; H01L 2924/01022; H01L 2924/01028
See application file for complete search history.

(56) References Cited

U.S. PATENT DOCUMENTS

2018/0090460 A1* 3/2018 Chu ................... H01L 23/562

OTHER PUBLICATIONS

Xu, Huifang et al., "Natural Indices for the Chemical Hardness/Softness of Metal Cations and Ligands," ACS Omega 2017, vol. 2, pp. 7185-7193.

* cited by examiner

*Primary Examiner* — Jasmine J Clark
(74) *Attorney, Agent, or Firm* — Slater Matsil, LLP

(57) ABSTRACT

In an embodiment, a device includes: a semiconductor substrate; a contact pad on the semiconductor substrate; a passivation layer on the contact pad and the semiconductor substrate; a die connector extending through the passivation layer, the die connector being physically and electrically coupled to the contact pad, the die connector including a first conductive material, the first conductive material being a Lewis acid having a first acid hardness/softness index; a dielectric layer on the die connector and the passivation layer; and a protective layer disposed between the dielectric layer and the die connector, the protective layer surrounding the die connector, the protective layer including a coordination complex of the first conductive material and an azole, the azole being a Lewis base having a first ligand hardness/softness index, where a product of the first acid hardness/softness index and the first ligand hardness/softness index is positive.

20 Claims, 26 Drawing Sheets

(51) Int. Cl.
  *H01L 25/10* (2006.01)
  *H01L 21/48* (2006.01)
  *H01L 21/56* (2006.01)
  *H01L 21/78* (2006.01)
  *H01L 25/18* (2006.01)
  *H01L 21/66* (2006.01)
  *H01L 23/31* (2006.01)
  *H01L 23/538* (2006.01)
  *H01L 25/065* (2006.01)

(52) U.S. Cl.
  CPC .......... *H01L 21/565* (2013.01); *H01L 21/568* (2013.01); *H01L 21/6835* (2013.01); *H01L 21/78* (2013.01); *H01L 22/12* (2013.01); *H01L 23/3128* (2013.01); *H01L 23/5383* (2013.01); *H01L 23/5386* (2013.01); *H01L 23/5389* (2013.01); *H01L 24/13* (2013.01); *H01L 24/19* (2013.01); *H01L 24/20* (2013.01); *H01L 25/0655* (2013.01); *H01L 25/105* (2013.01); *H01L 25/18* (2013.01); *H01L 2221/68372* (2013.01); *H01L 2224/117* (2013.01); *H01L 2224/1146* (2013.01); *H01L 2224/11614* (2013.01); *H01L 2224/11849* (2013.01); *H01L 2224/13584* (2013.01); *H01L 2224/13611* (2013.01); *H01L 2224/13624* (2013.01); *H01L 2224/13639* (2013.01); *H01L 2224/13644* (2013.01); *H01L 2224/13647* (2013.01); *H01L 2224/13655* (2013.01); *H01L 2224/13666* (2013.01); *H01L 2224/13684* (2013.01); *H01L 2224/214* (2013.01); *H01L 2225/1035* (2013.01); *H01L 2225/1058* (2013.01); *H01L 2924/014* (2013.01); *H01L 2924/0105* (2013.01); *H01L 2924/01013* (2013.01); *H01L 2924/01022* (2013.01); *H01L 2924/01028* (2013.01); *H01L 2924/01029* (2013.01); *H01L 2924/01047* (2013.01); *H01L 2924/01074* (2013.01); *H01L 2924/01079* (2013.01)

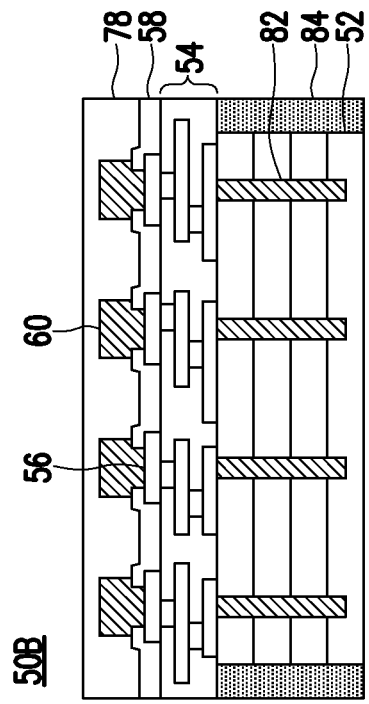
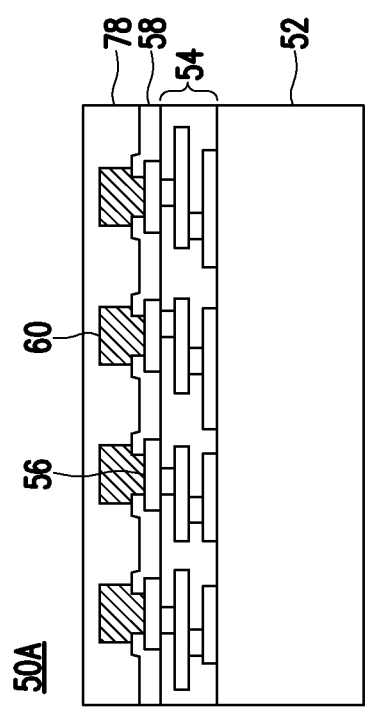

INTEGRATED CIRCUIT PACKAGE AND METHOD

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A and 6B are cross-sectional views of integrated circuit dies, in accordance with various embodiments.

DETAILED DESCRIPTION

Figure 1:
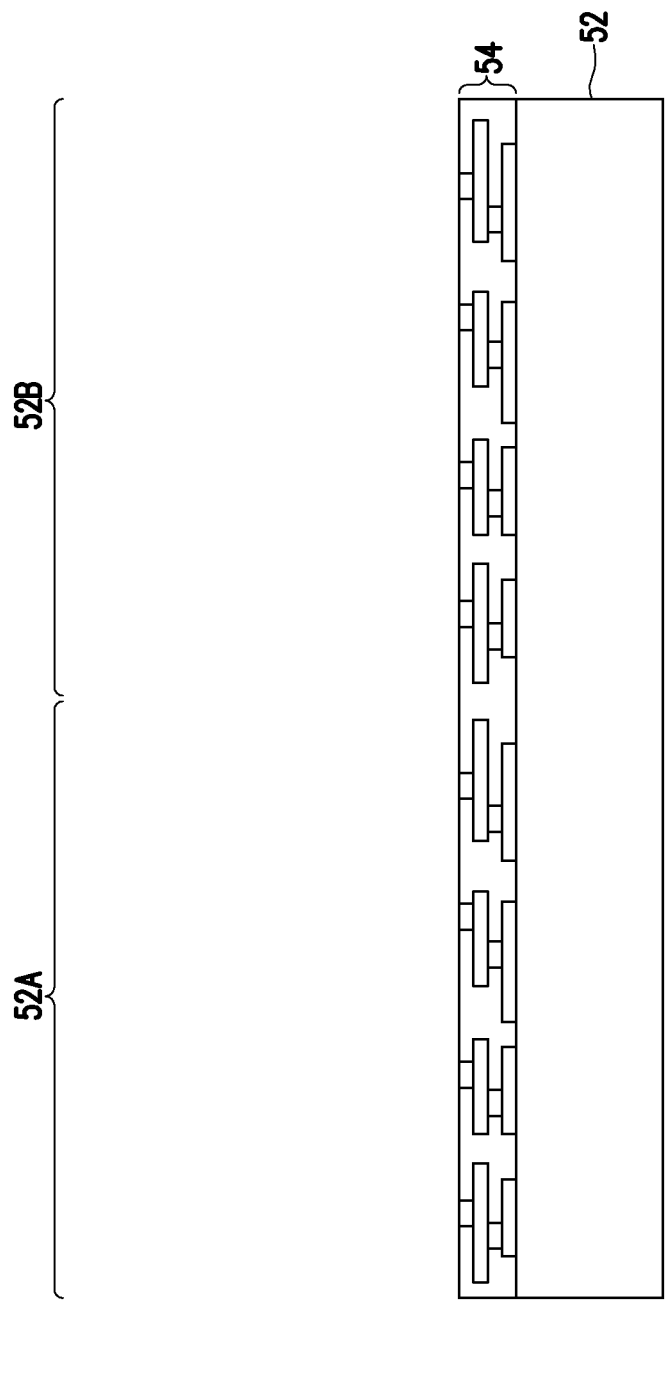
FIGS. 1 through 5 are cross-sectional views of intermediate steps during a process for forming integrated circuit dies, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a chip probe is attached to a die connector, and used to test for known good dies (KGDs). The chip probe is attached with a reflowable connector. After the chip probe is removed, the reflowable connector is removed by a wet etching process. The wet etching process includes etching the reflowable connector with an etching solution having a protective agent. The protective agent is a soft Lewis base, such as an azole compound, which forms strong covalent bonds with the material of the die connector. The die connector may thus be protected during the wet etching process.

FIGS. 1 through 5 are cross-sectional views of intermediate steps during a process for forming integrated circuit dies 50, in accordance with some embodiments. The integrated circuit dies 50 will be packaged in subsequent processing to form integrated circuit package. Each integrated circuit die 50 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

In FIG. 1, a semiconductor substrate 52 is provided. The semiconductor substrate 52 may be silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side. Devices are formed at the active surface of the semiconductor substrate. The devices may be active devices (e.g., transistors, diodes, etc.) or passive devices (e.g., capacitors, resistors, inductors, etc.).

The semiconductor substrate 52 has multiple device regions, and an integrated circuit die 50 is formed in and/or on each of the device regions. A first device region 52A and a second device region 52B are illustrated, but it should be appreciated that the semiconductor substrate 52 may have any number of device regions.

An interconnect structure 54 is formed over the semiconductor substrate 52. The interconnect structure 54 interconnects the devices of the semiconductor substrate 52 to form integrated circuits in each of the device regions 52A and 52B. The interconnect structure 54 may be formed of, for example, metallization patterns in dielectric layers. The metallization patterns include metal lines and vias formed in one or more low-k dielectric layers. The interconnect structure 54 may formed by a damascene process, such as a single damascene process, a dual damascene process, or the like. The metallization patterns of the interconnect structure 54 are electrically coupled to the devices of the semiconductor substrate 52.

Figure 2:
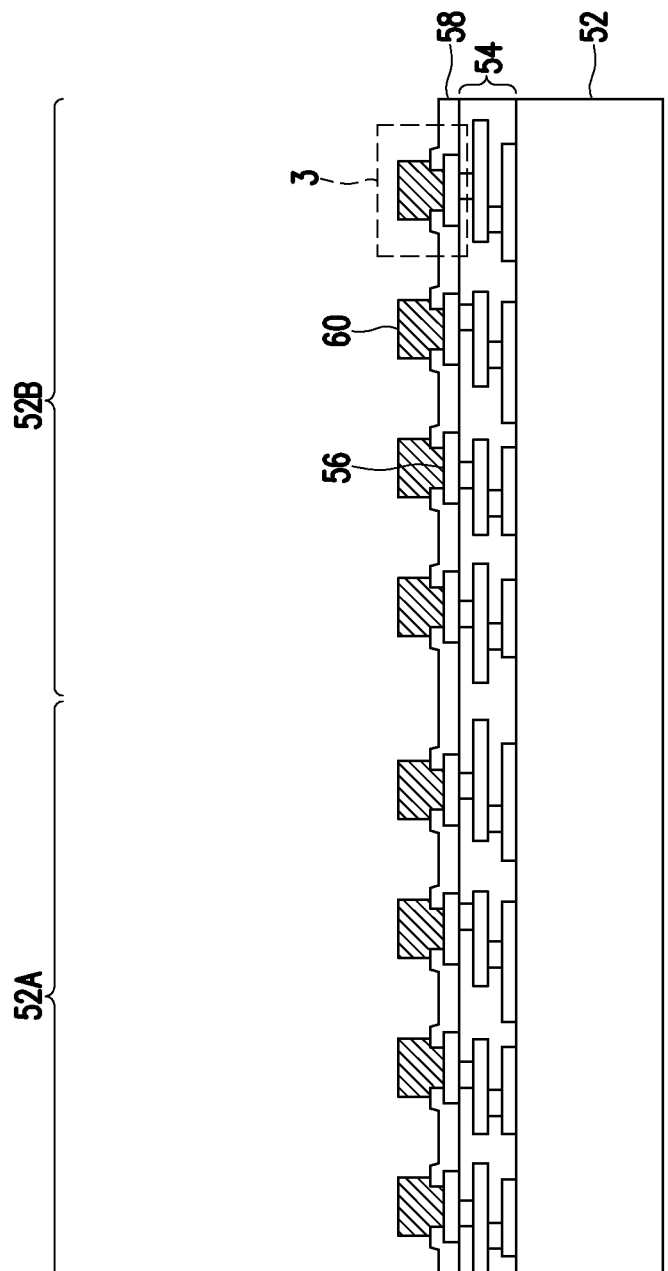

In FIG. 2, contact pads 56 are formed on the front side of the integrated circuit die 50, such as in and/or on the interconnect structure 54. The contact pads 56 may be aluminum pads, copper pads, or the like, to which external connections are made. In some embodiments, the contact pads 56 are part of the topmost metallization pattern of the interconnect structure 54.

One or more passivation layer(s) 58 are formed on the contact pads 56 and interconnect structure 54. The passivation layer(s) 58 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, solder resist, polybenzoxazole (PBO), benzocyclobutene (BCB), molding compound, the like, or a combination thereof. The passivation layer(s) 58 may be formed by spin coating, lamination, CVD, the like, or a combination thereof.

Die connectors 60, such as conductive pillars (for example, formed of a metal such as copper), are formed extending through the passivation layer(s) 58 to be physically and electrically coupled to the contact pads 56. The die connectors 60 are thus electrically coupled the respective integrated circuits of the integrated circuit dies 50. The die connectors 60 may be referred to as conductive vias. FIGS. 3A through 3F are cross-sectional views of intermediate steps during a process for forming the die connectors 60, in accordance with some embodiments. In particular, a region 3 in FIG. 2 is shown in more detail. Although the formation of a single die connector 60 is illustrated, it should be appreciated that multiple die connectors 60 are formed simultaneously.

Figure 3A:
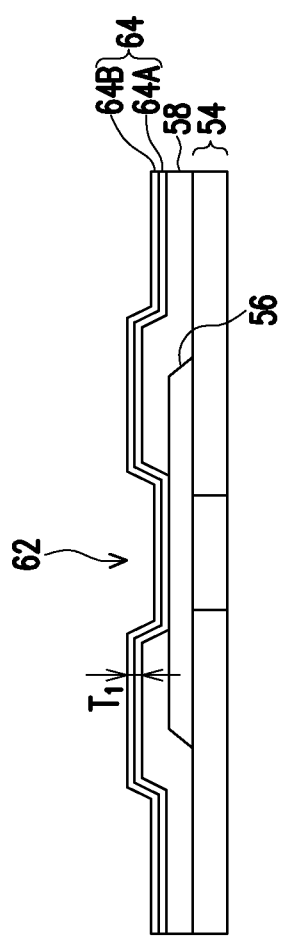

In FIG. 3A, the passivation layer(s) 58 are patterned to form openings 62 exposing portions of the contact pads 56. The patterning may be by an acceptable process, such as by exposing the passivation layer(s) 58 to light when the passivation layer(s) 58 are photo-sensitive materials, or by etching using, for example, an anisotropic etch. If the passivation layer(s) 58 are photo-sensitive materials, the passivation layer(s) 58 can be developed after the exposure.

After the passivation layer(s) 58 are patterned, a seed layer 64 is formed over the passivation layer(s) 58 and in the openings 62 exposing the contact pads 56. In some embodiments, the seed layer 64 is a metal layer, which may be a single layer or a composite layer comprising a plurality of sub-layers formed of different materials. In some embodiments, the seed layer 64 comprises a titanium layer 64A and a copper layer 64B over the titanium layer 64A. The seed layer 64 may be formed using, for example, PVD or the like. The seed layer 64 can be formed to a thickness $T_1$ in the range of about 0.01 μm to about 2.0 μm.

Figure 3B:
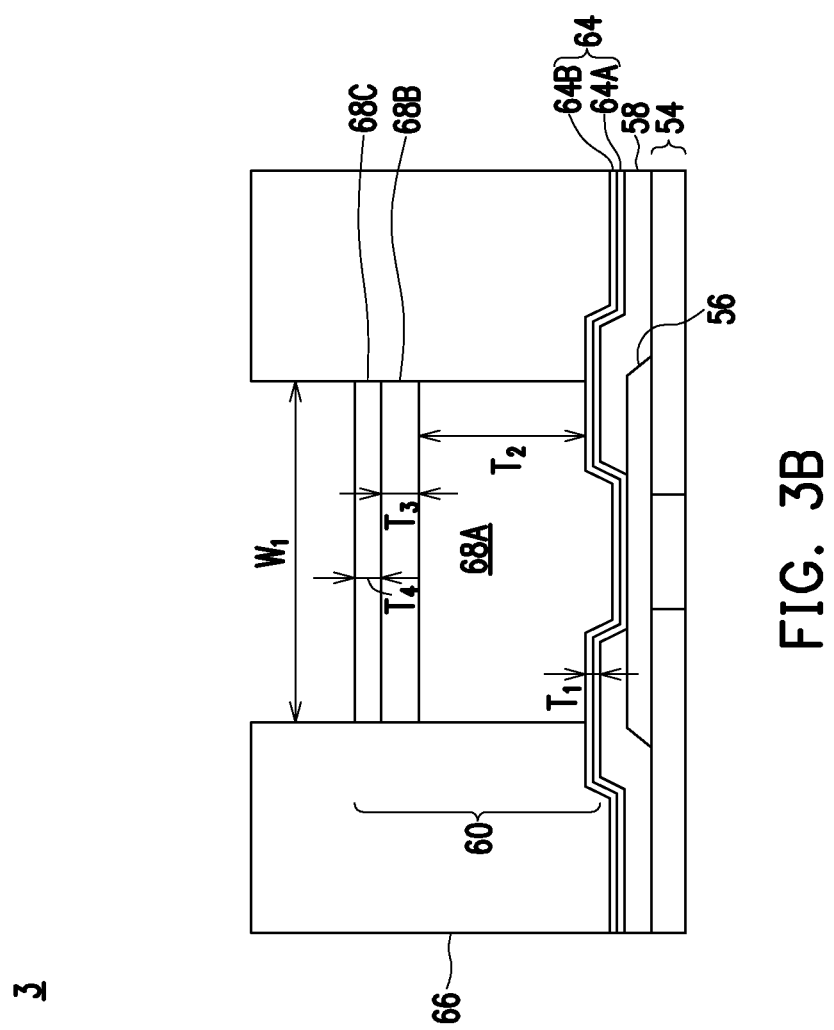

In FIG. 3B, a photoresist 66 is formed and patterned on the seed layer 64. The photoresist 66 may be formed by spin coating or the like and may be exposed to light for patterning. The pattern of the photoresist 66 corresponds to the die connectors 60. The patterning forms openings through the photoresist 66 to expose the seed layer 64.

First conductive material layers 68A are then formed in the openings of the photoresist 66 and on the exposed portions of the seed layer 64. The first conductive material layers 68A may be formed by plating, such as electroplating or electroless plating, or the like. The first conductive material layers 68A may comprise a metal, like copper, titanium, tungsten, aluminum, or the like. In some embodiments, the first conductive material layers 68A are copper. The first conductive material layers 68A can be formed to a thickness $T_2$ in the range of about 1 μm to about 50 μm, such as about 15 μm.

Second conductive material layers 68B can optionally be formed on the first conductive material layers 68A. The second conductive material layers 68B may be formed in a manner similar to the first conductive material layers 68A, and may be formed of a different material than the first conductive material layers 68A. In some embodiments, the second conductive material layers 68B are nickel. The second conductive material layers 68B can be formed to a thickness $T_3$ in the range of about 0.1 μm to about 20 μm, such as about 3 μm. Forming nickel layers may help protect the copper of the first conductive material layers 68A from oxidation during further processing.

Third conductive material layers 68C can optionally be formed on the second conductive material layers 68B. The third conductive material layers 68C may be formed in a manner similar to the first conductive material layers 68A, and may be formed of a similar material as the first conductive material layers 68A. In some embodiments, the third conductive material layers 68C are copper. The third conductive material layers 68C can be formed to a thickness $T_4$ in the range of about 0.1 μm to about 20 μm, such as about 2 μm. Forming a copper layer may help prevent intermetallic compounds (IMCs) from forming in and/or on the second conductive material layers 68B when reflowable connectors are subsequently formed on the die connectors 60.

The openings in the photoresist 66, and thus the conductive material layers 68A, 68B, and 68C, can be formed to a width $W_1$ in the range of about 1 μm to about 150 μm. The combination of the conductive material layers 68A, 68B, and 68C, and the underlying portions of the seed layer 64 form the die connectors 60.

Figure 3C:
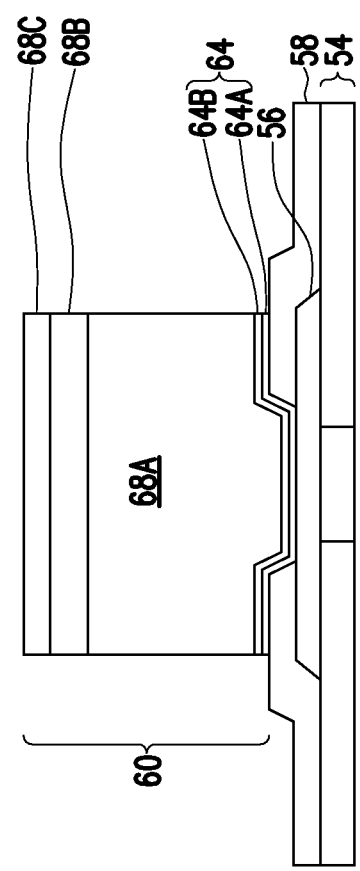

In FIG. 3C, the photoresist 66 and portions of the seed layer 64 on which the conductive material layers 68A, 68B, and 68C are not formed are removed. The photoresist 66 may be removed by an acceptable ashing or stripping process, such as using an oxygen plasma or the like. Once the photoresist 66 is removed, exposed portions of the seed layer 64 are removed, such as by using an acceptable etching process, such as by wet or dry etching.

Figure 3D:
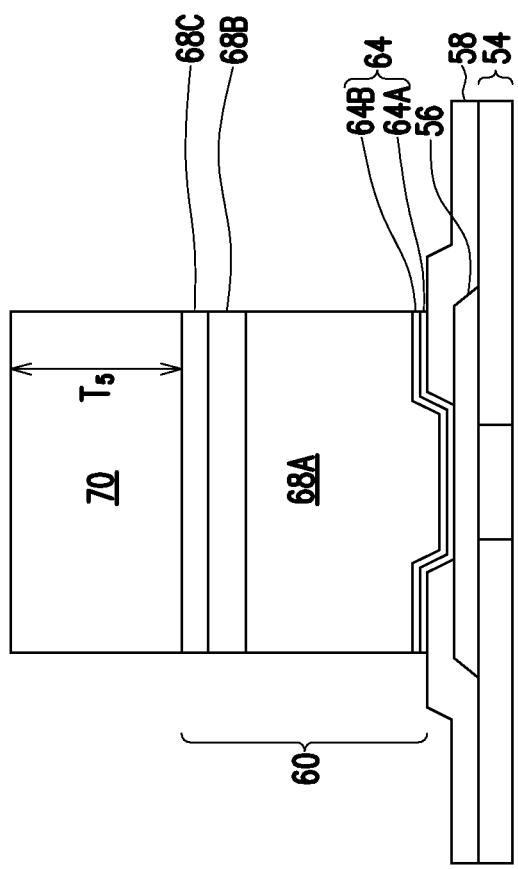

In FIG. 3D, reflowable connectors 70 are formed on the die connectors 60. The reflowable connectors 70 may include a conductive material such as solder, gold, silver, tin, the like, or combinations thereof. In some embodiments, the reflowable connectors 70 are formed by initially forming a layer of solder through evaporation, electroplating, printing, solder transfer, ball placement, or the like. The reflowable connectors 70 may be formed after the photoresist 66 is removed, or may be formed in the openings of the photoresist 66 before the photoresist 66 is removed. Once layers of solder have been formed on the die connectors 60, a reflow may optionally be performed in order to shape the material into the desired bump shapes. The reflowable connectors 70 are thick. For example, the reflowable connectors 70 can be formed to a thickness $T_5$ in the range of about 1 μm to about 50 μm, such as about 15 μm.

Figure 3E:
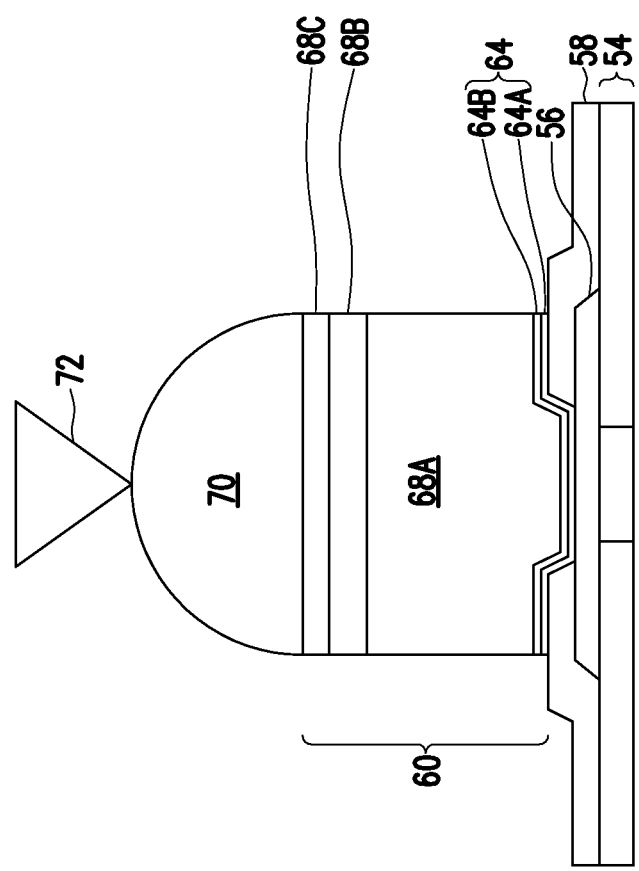

In FIG. 3E, the integrated circuit dies 50 are tested by use of a chip probe 72. The chip probe 72 is physically and electrically coupled to the die connectors 60 by reflowing the reflowable connectors 70, which may shape the reflowable connectors 70 into bump shapes. Chip probe testing may be performed on the integrated circuit dies 50 to ascertain whether the integrated circuit dies 50 are known good dies (KGDs). Thus, only integrated circuit dies 50 which are KGDs undergo subsequent processing and packaging, and integrated circuit dies 50 which fail the CP testing are not packaged. The testing may include testing of the functionality of the various integrated circuit dies 50, or may include testing for known open or short circuits that may be expected based on the design of the integrated circuit devices.

Figure 3F:
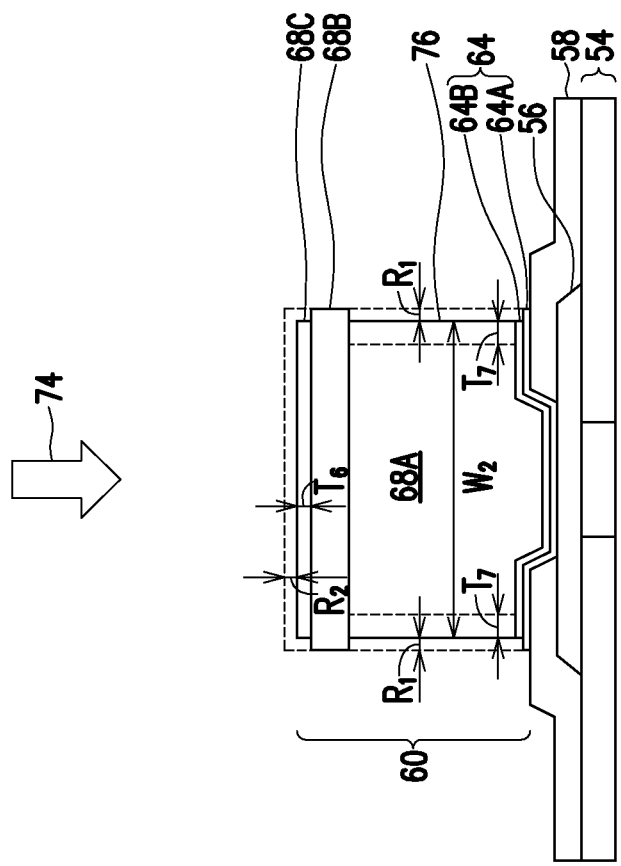

In FIG. 3F, the chip probe 72 is detached from the die connectors 60 and removed. Detachment may be accomplished by reflowing the reflowable connectors 70. After detaching the chip probe 72, an etching process 74 is performed to remove remaining portions of the reflowable connectors 70. The etching process 74 is selective to the material of the reflowable connectors 70, such that the material of the reflowable connectors 70 is etched faster than the materials of the die connectors 60.

Although the etching process 74 is selective to desired materials (e.g., the material of the reflowable connectors 70), etching of some undesired materials (e.g., the materials of the die connectors 60) still occurs. Further, etching of the undesired materials may occur at different rates. For example, the etching process 74 may etch solder at a higher rate than copper, and may etch copper at a higher rate than titanium and nickel. As such, the dimensions of the conductive material layers 68A and 68C and copper layer 64B may be reduced by the etching process 74, while the dimensions of the conductive material layer 68B (e.g., nickel) and the titanium layer 64A may not be reduced by an appreciable amount. After removal of the reflowable connectors 70, the conductive material layer 68B and titanium layer 64A may substantially retain the original width $W_1$, but the conductive material layers 68A and 68C and copper layer 64B may be reduced to a lesser width $W_2$, such as a width $W_2$ in the range of about 0.7 μm to about 149 μm. The amount of reduction $R_1$ can be in the range of about 0.0005 μm to about 45 μm, such as about 0.1 μm, which may account for about 0.05% to about 30% of the original width $W_1$. Further, the thickness of the conductive material layer 68C may be reduced to a lesser thickness $T_6$, such as a thickness $T_6$ in the range of about 0.07 μm to about 19.99 μm. The amount of reduction $R_2$ can be in the range of about 0.001 μm to about 6 μm, such as about 0.1 μm, which may account for about 0.05% to about 30% of the original thickness $T_4$.

In some embodiments, the etching process 74 is a wet etch performed with a water-based etching solution that includes an etching agent for the material of the reflowable connectors 70, and a protective agent for the materials of the die connectors 60. The etching agent reacts with the material of the reflowable connectors 70 to convert it from solid phase to liquid phase. In some embodiments, the etching agent is an oxidized metal ion. For example, iron(III) oxide, copper (II) oxide, or the like may be used to remove the material of the reflowable connectors 70. The protective agent (discussed further below) reacts with the materials of the die connectors 60 to form a protective layer 76 that reduces the etch rate of the die connectors 60. The etching agent and protective agent are dissolved in a solvent, which may be any solvent capable of dissolving the etching agent and protective agent. Example solvents include nitric acid, sulfuric acid, and the like. The concentration of the protective agent in the etching solution may be small. For example, the etching solution may include from 1 ppm to 20000 ppm of the protective agent, which may represent a concentration in the range of about 0.0001% to about 2%. Conversely, the etching solution may include the etching agent at a concentration in the range of about 0.1% to about 20%, and may include the solvent in the range of about 0.5% to about 50%.

During the etching process 74, the etching solution may be dispensed on the intermediate structure (including the die connectors 60 and reflowable connectors 70) by the use of several techniques. In some embodiments, the intermediate structure is immersed in a bath of the etching solution. In some embodiments, the etching solution is sprayed on the intermediate structure. Spraying the etching solution on the intermediate structure may include spinning the intermediate structure while flowing the etching solution over the intermediate structure. The intermediate structure may be spun at a low speed, such as a speed in the range of about 100 RPM to about 3000 RPM. Likewise, the etching solution may be flowed at a high rate, such as at a flow rate in the range of about 0.2 L/min to about 2 L/min. Regardless of how the etching solution is dispensed, the etching process 74 may be performed at a low temperature, such as a temperature in the range of about 5° C. to about 50° C. Further, the etching process 74 may be performed for any desired duration, such as a duration in the range of about 0.1 minutes to about 120 minutes.

As noted above, the protective agent in the etching solution reacts with the materials of the die connectors 60 to form a protective layer 76 that reduces the etch rate of the die connectors 60. In particular, the protective agent is an organic ligand that reacts with the material (e.g., copper) of the conductive material layers 68A and 68C and copper layer 64B to form a protective layer 76 of a coordination complex at the exposed surfaces of the layers. The coordination complex chemically impedes the reaction of the etching agent with the exposed copper. Advantageously, formation of the protective layer 76 allows the amount of reduction $R_1$ and $R_2$ during the etching process 74 to be small. In some embodiments, the protective layer 76 is a monolayer at the surface of the conductive material layers 68A and 68C and copper layer 64B. In some embodiments, the protective layer 76 extends at least partially into the conductive material layers 68A and 68C and copper layer 64B, such that the layers have an outer region including the coordination complex, and an inner region that is free of the coordination complex. The protective layer 76 is thin, having a thickness $T_7$ that can be in the range of about 1 Å to about 100 Å. The protective layer 76 may remain after the etching process 74, and may be part of the resulting integrated circuit dies 50.

The metals of the die connectors 60 and reflowable connectors 70 are Lewis acids, and the ligand of the protective agent is a Lewis base. According to Pearson's Hard Soft Acid Base (HSAB) theorem, "hard" Lewis acids (e.g., those with a high charge density and small radius) form strong ionic bonds with "hard" Lewis bases, and "soft" Lewis acids (e.g., those with a low charge density and large radius) form strong covalent bonds with "soft" Lewis bases. Although Lewis acids and bases are typically categorized qualitatively as "hard" or "soft," efforts have been made to quantify the precise hardness/softness of Lewis acids and bases. For example, Xu et al., in "Natural Indices for the Chemical Hardness/Softness of Metal Cations and Ligands," ACS Omega 2017 2 (10), pp. 7185-7193, incorporated herein by reference in its entirety, suggest that Gibbs free energies of formation of cations ($\Delta G°_{f,M}{}^{n+}$) are natural indices for the hardness/softness of Lewis acids. According to this definition, acids with positive $\Delta G°_{f,M}{}^{n+}$ values are "soft" Lewis acids, and those with negative $\Delta G°_{f,M}{}^{n+}$ values are "hard" Lewis acids. Xu et al. further suggest that coefficients $\alpha^*_{ML}$ can be derived from experimental data for various Lewis bases, and that each coefficient $\alpha^*_{ML}$ is an index for the hardness/softness of the corresponding Lewis bases. Positive $\alpha^*_{ML}$ values indicate "soft" Lewis bases, and negative $\alpha^*_{ML}$ values indicate "hard" Lewis bases. Based on these indices, the bond strength between a given Lewis acid and base in a complex may be empirically determined by computing the product of the hardness/softness indices for the Lewis acid and base. When the product is a positive value (e.g., greater than zero), then a strong bond (ionic or covalent) will be formed between the Lewis acid and base. When the product is a negative value (e.g., less than zero), then a weak bond will be formed between the Lewis acid and base.

Copper is a "soft" Lewis acid (e.g., has a positive $\Delta G°_{f,M}{}^{n+}$ value). Conversely, tin and nickel are "hard" Lewis acids (e.g., have negative $\Delta G°_{f,M}{}^{n+}$ values). In accordance with some embodiments, the protective agent in the etching solution is a "soft" Lewis base (e.g., has a positive $\alpha^*_{ML}$ value). Based on Pearson's HSAB theorem, the protective agent will thus form a strong covalent bond with copper, and will not form strong bonds with tin or nickel. In other words, the protective agent will react with the material (e.g., copper) of the conductive material layers 68A and 68C and copper layer 64B, substantially without reacting with the materials (e.g., tin/nickel) of the conductive material layer 68B, titanium layer 64A, and reflowable connectors 70.

The protective agent may be any "soft" Lewis base, but azole-derived Lewis base may be particularly desirable, as they have large positive $\alpha^*mL$ values (e.g., at least 0.0794), are non-toxic, and have a low cost compared to other Lewis bases. In some embodiments, the azole is a five-membered heterocyclic compound containing a plurality of nitrogen atoms, which allows the azole compound to have more than one active site for bonding with copper. Several types of azoles may be used. For example, the azole may be a pirazole compound (e.g., methylpyrazole), an imidazole compound (e.g., methylimidazole), a triazole compound (e.g., benzotriazole), a tetrazole compound (e.g., phenyltetrazole or phenyl-mercaptotetrazole), or a pentazole compound (e.g., pentazole (e.g., $HN_5$)). It should be appreciated that other types of azoles, and indeed, other "soft" Lewis bases, may also be used for the protective agent.

Although described as a single process, it should be appreciated that the steps illustrated in FIGS. 3A through 3F may be split into multiple processes. For example, a first process comprising the steps illustrated in FIGS. 3A through 3D may be performed to obtain an intermediate structure. A second process comprising the steps illustrated in FIGS. 3E through 3F may be performed after obtaining or receiving the intermediate structure from the first process.

Figure 4:
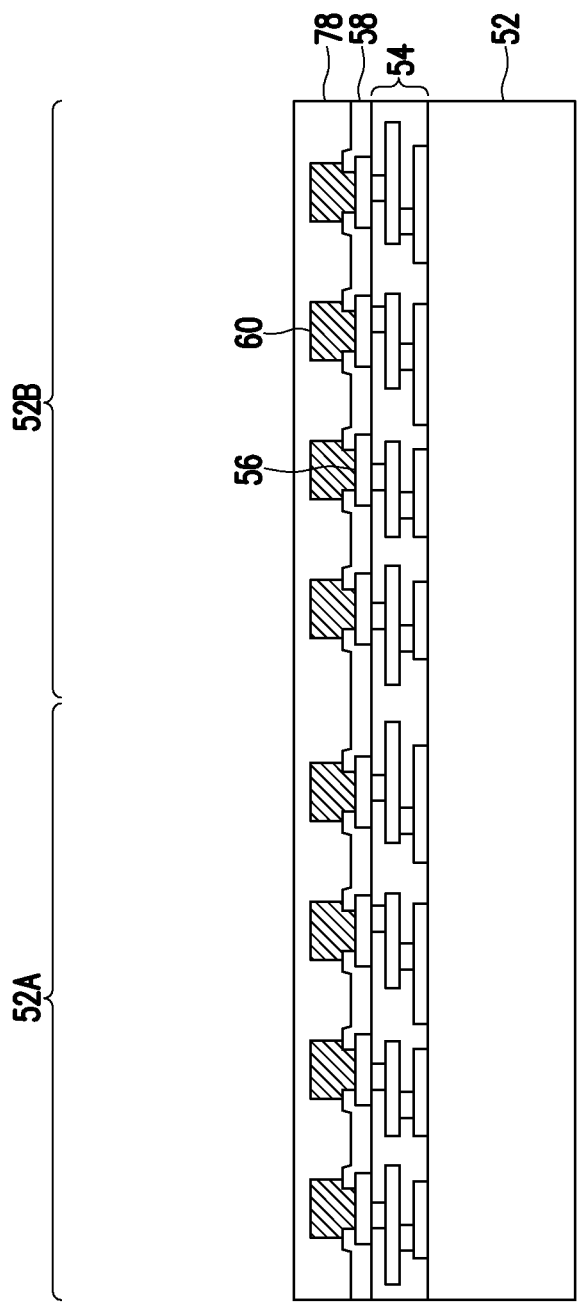

In FIG. 4, dielectric layer 78 is formed on the front side of the integrated circuit die 50, such as on the passivation layer(s) 58 and the die connectors 60. The dielectric layer 78 laterally encapsulates the die connectors 60. The dielectric layer 78 may be a polymer such as PBO, polyimide, BCB, or the like; a nitride such as silicon nitride or the like; an oxide such as silicon oxide, PSG, BSG, BPSG, or the like; the like, or a combination thereof. The dielectric layer 78 may be formed, for example, by spin coating, lamination, chemical vapor deposition (CVD), or the like. Initially, the dielectric layer 78 may bury the die connectors 60, such that the topmost surface of the dielectric layer 78 is above the topmost surfaces of the die connectors 60. In some embodiments, the die connectors 60 are exposed through the dielectric layer 78 during formation of the integrated circuit die 50. In some embodiments, the die connectors 60 remain buried and are exposed during a subsequent process for packaging the integrated circuit die 50.

Removing the reflowable connectors 70 from the die connectors 60 before forming the dielectric layer 78 may prevent solder wetting during the curing process for the dielectric layer 78 when the dielectric layer 78 is a polymer such as PBO. Further, removing the reflowable connectors 70 by the etching process 74 instead of other process (such as a CMP) may help reduce the amount of solder residue in the dielectric layer 78. Finally, removing the reflowable connectors 70 by the etching process 74 is less damaging to the die connectors 60, which may help increase the reliability and electrical performance of the die connectors 60

Figure 5:
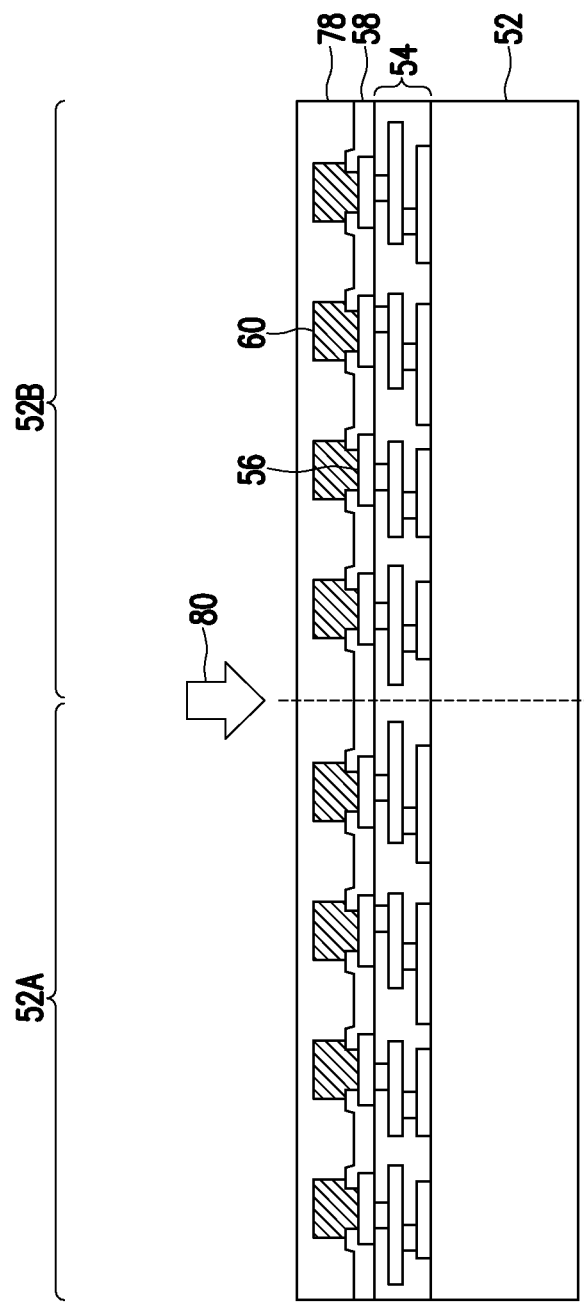

In FIG. 5, a singulation process 80 is performed by sawing along scribe line regions, e.g., between the device regions 52A and 52B. The singulation process 80 singulates the device regions 52A and 52B. The resulting, singulated integrated circuit dies 50 are from the device regions 52A and 52B. FIGS. 6A and 6B are cross-sectional views of the resulting integrated circuit dies 50, in accordance with various embodiments.

FIG. 6A shows a first type of integrated circuit die 50A. The first integrated circuit die 50A has a single semiconductor substrate 52, and is similar to the embodiment discussed with respect to FIGS. 1 through 5. The first integrated circuit die 50A may be a logic device, such as a central processing unit (CPU), graphics processing unit (GPU), system-on-a-chip (SoC), microcontroller, or the like.

FIG. 6B shows a second type of integrated circuit die 50B. The second integrated circuit die 50B may be a memory device, such as a dynamic random access memory (DRAM) die, static random access memory (SRAM) die, hybrid memory cube (HMC) module, a high bandwidth memory (HBM) module, or the like. The second integrated circuit die 50B is a stacked device that includes multiple semiconductor substrates 52. For example, the second integrated circuit die 50B may be a memory device such as a hybrid memory cube (HMC) module, a high bandwidth memory (HBM) module, or the like that includes multiple memory dies. The semiconductor substrates 52 may be interconnected by through-substrate vias (TSVs) 82 extending partially into or completely through the semiconductor substrates 52. The stacked semiconductor substrates 52 may share an interconnect structure 54, or each semiconductor substrate 52 may have its own interconnect structure 54. Further, an encapsulant 84 may be formed around the stacked semiconductor substrates 52. The encapsulant 84 may be a molding compound, epoxy, or the like.

FIGS. 7 through 14 illustrate cross-sectional views of intermediate steps during a process for forming a first package component 100, in accordance with some embodiments. The first package component 100 has multiple package regions, and one or more of the integrated circuit dies 50 are packaged to form an integrated circuit package in each of the package regions. A first package region 100A and a second package region 100B are illustrated, but it should be appreciated that the first package component 100 may have any number of package regions. After formation, the integrated circuit packages in each of the package regions are singulated. The resulting integrated circuit packages may also be referred to as integrated fan-out (InFO) packages.

Figure 7:
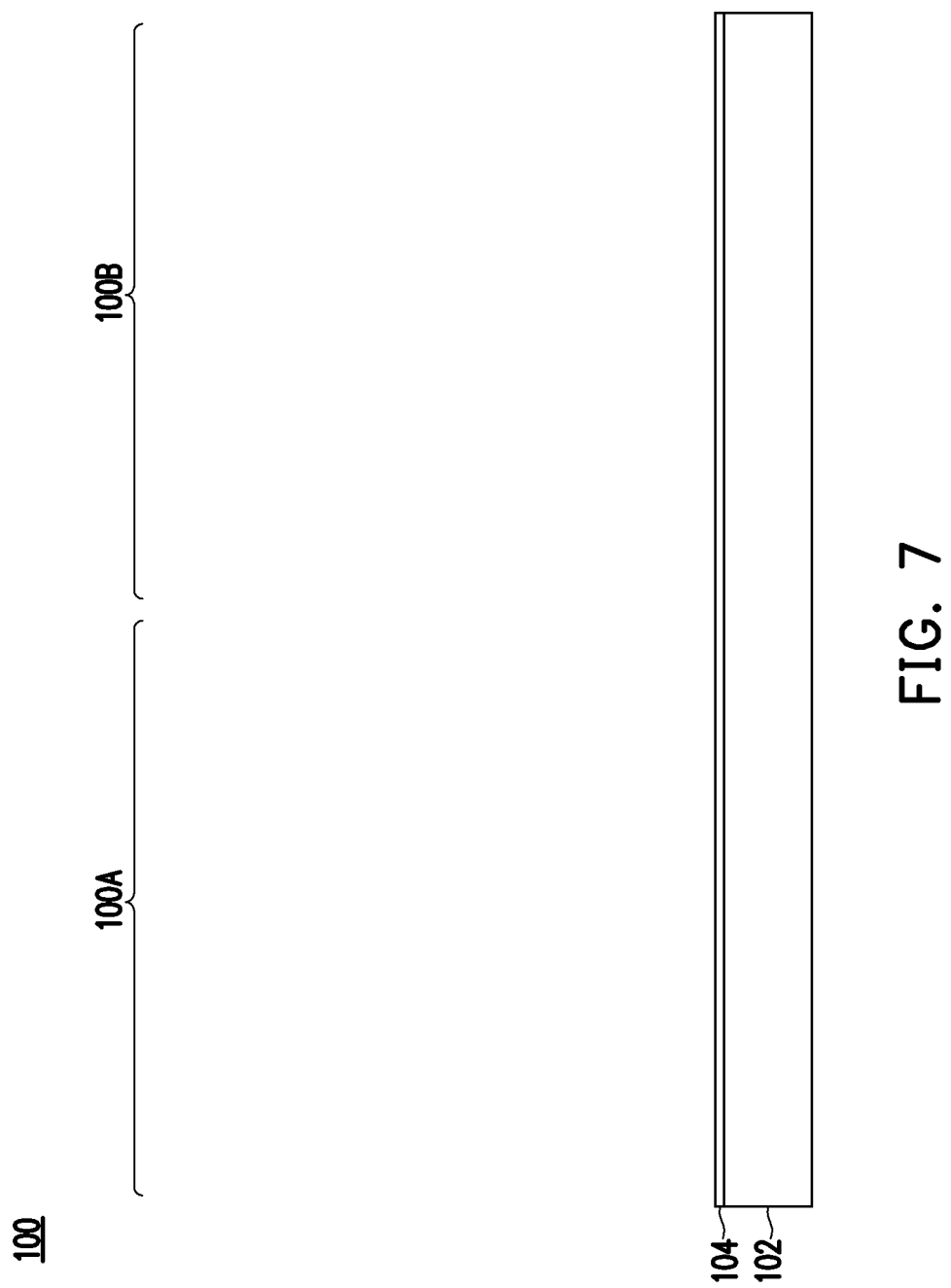
FIGS. 7 through 14 illustrate cross-sectional views of intermediate steps during a process for forming a package component, in accordance with some embodiments.

In FIG. 7, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously. The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of planarity.

Figure 8:
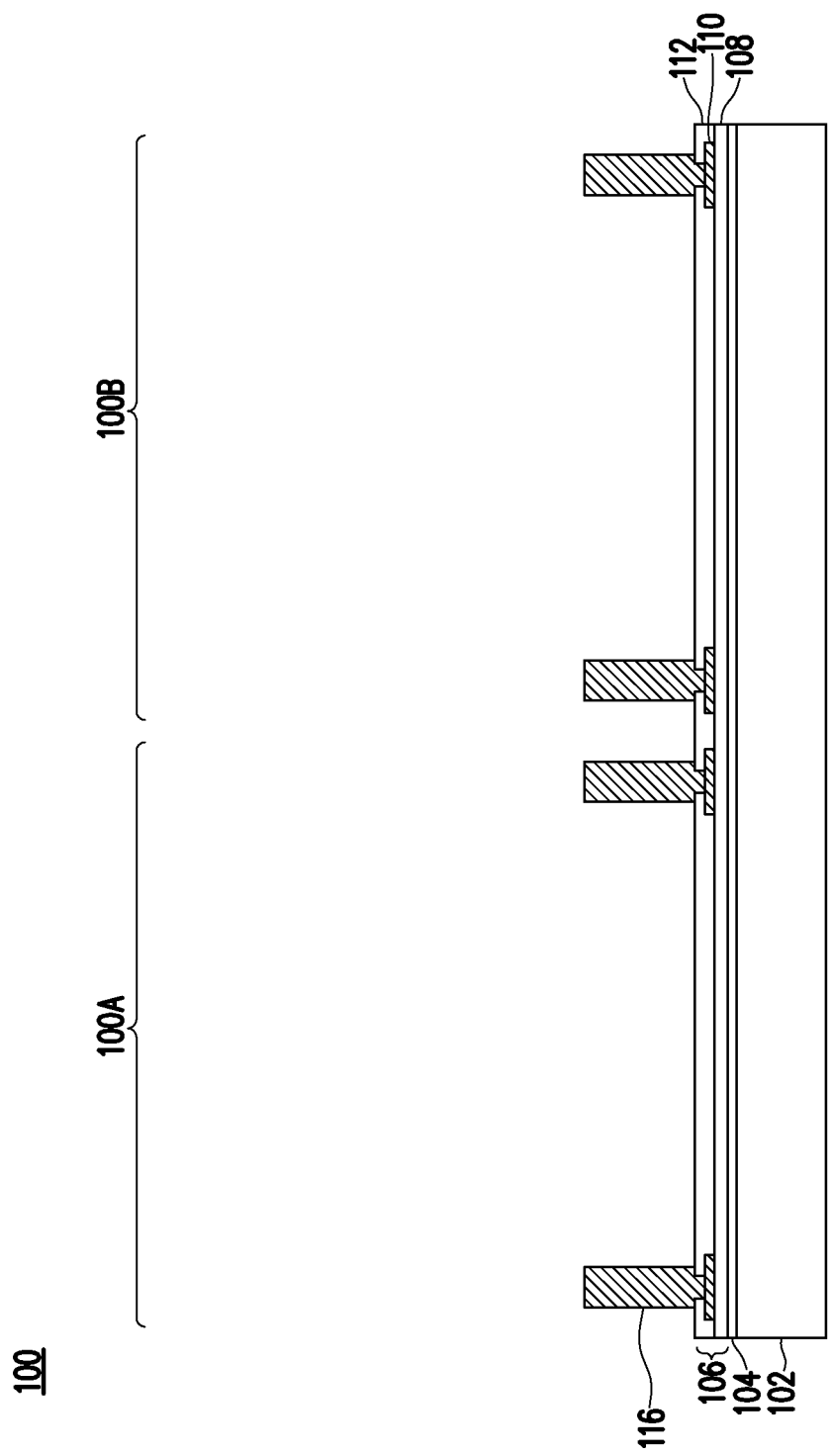

In FIG. 8, a back-side redistribution structure 106 may be formed on the release layer 104. In the embodiment shown, the back-side redistribution structure 106 includes a dielectric layer 108, a metallization pattern 110 (sometimes referred to as redistribution layers or redistribution lines), and a dielectric layer 112. The back-side redistribution structure 106 is optional. In some embodiments, a dielectric layer without metallization patterns is formed on the release layer 104 in lieu of the back-side redistribution structure 106.

The dielectric layer 108 may be formed on the release layer 104. The bottom surface of the dielectric layer 108 may be in contact with the top surface of the release layer 104. In some embodiments, the dielectric layer 108 is formed of a polymer, such as polybenzoxazole (PBO), polyimide, benzocyclobutene (BCB), or the like. In other embodiments, the dielectric layer 108 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 108 may be formed by any acceptable deposition process, such as spin coating, CVD, laminating, the like, or a combination thereof.

The metallization pattern 110 may be formed on the dielectric layer 108. As an example to form metallization pattern 110, a seed layer is formed over the dielectric layer 108. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the metallization pattern 110. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 110.

The dielectric layer 112 may be formed on the metallization pattern 110 and the dielectric layer 108. In some embodiments, the dielectric layer 112 is formed of a polymer, which may be a photo-sensitive material such as PBO, polyimide, BCB, or the like, that may be patterned using a lithography mask. In other embodiments, the dielectric layer 112 is formed of a nitride such as silicon nitride; an oxide such as silicon oxide, PSG, BSG, BPSG; or the like. The dielectric layer 112 may be formed by spin coating, lamination, CVD, the like, or a combination thereof.

It should be appreciated that the back-side redistribution structure 106 may include any number of dielectric layers and metallization patterns. If more dielectric layers and metallization patterns are to be formed, steps and processes discussed above may be repeated. The metallization patterns may include conductive lines and conductive vias. The conductive vias may be formed during the formation of the metallization pattern by forming the seed layer and conductive material of the metallization pattern in the opening of the underlying dielectric layer. The conductive vias may therefore interconnect and electrically couple the various conductive lines.

Next, through vias 116 are formed extending through and away from the topmost dielectric layer of the back-side redistribution structure 106 (e.g., the dielectric layer 112). The through vias 116 are optional, and as discussed further below, may be omitted. For example, the through vias 116 may (or may not) be omitted in embodiments where the back-side redistribution structure 106 is omitted. As an example to form the through vias 116, the dielectric layer 112 can be patterned to form openings exposing portions of the metallization pattern 110. The patterning may be formed by an acceptable process, such as by exposing the dielectric layer 112 to light when the dielectric layer 112 is a photo-sensitive material or by etching using, for example, an anisotropic etch. If the dielectric layer 112 is a photo-sensitive material, the dielectric layer 112 can be developed after the exposure. A seed layer is then formed over the dielectric layer 112 and portions of the metallization pattern 110 exposed by the openings. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed.

The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the through vias 116.

Figure 9:
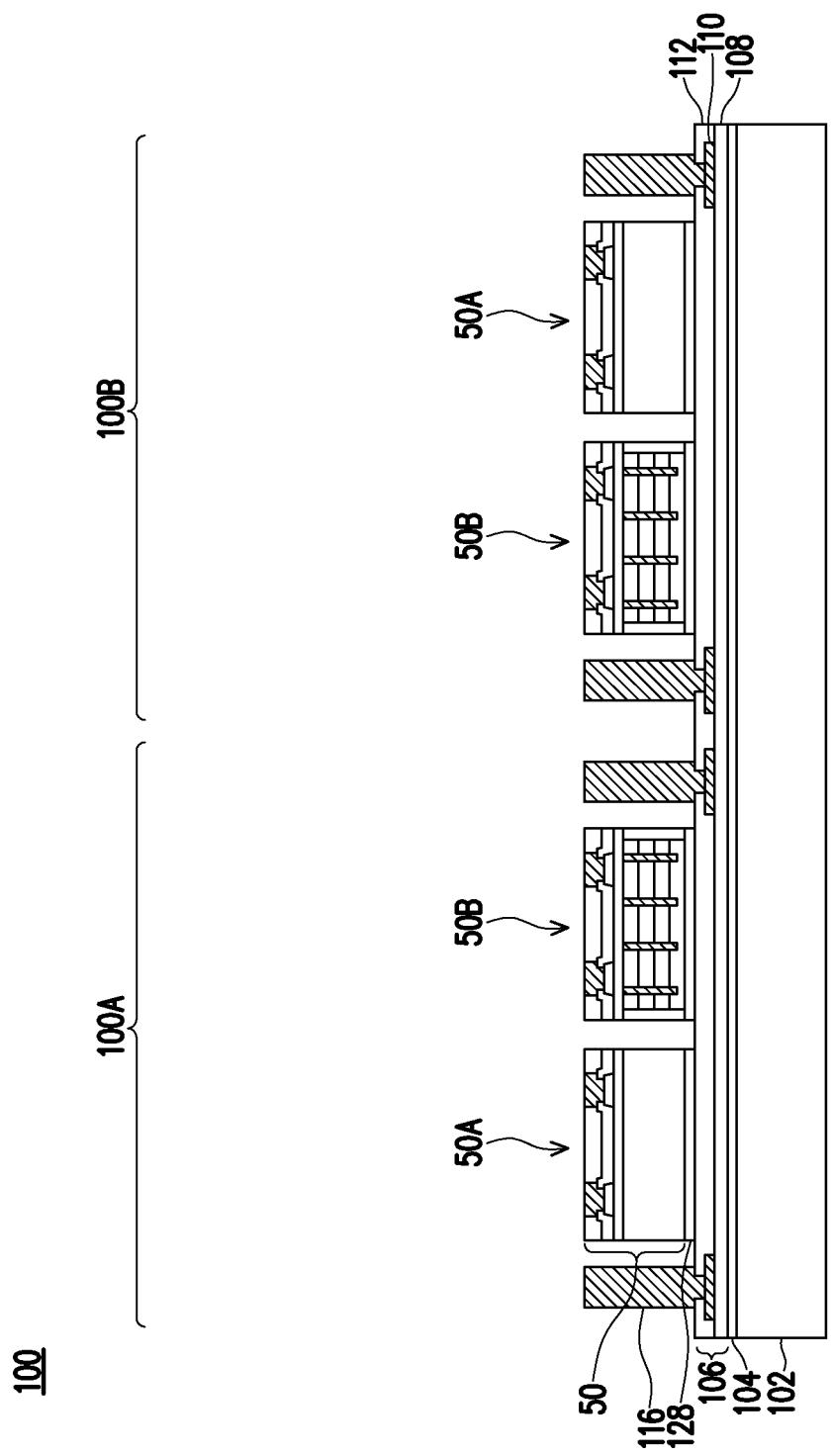

In FIG. 9, integrated circuit dies 50 are adhered to the dielectric layer 112 by an adhesive 128. A desired type and quantity of integrated circuit dies 50 are adhered in each of the package regions 100A and 100B. In the embodiment shown, multiple integrated circuit dies 50, such as a first integrated circuit die 50A and a second integrated circuit die 50B, are adhered adjacent one another in each package region. The adhesive 128 is on back-sides of the integrated circuit dies 50A and 50B and adheres the integrated circuit dies 50A and 50B to the back-side redistribution structure 106, such as to the dielectric layer 112. The adhesive 128 may be any suitable adhesive, epoxy, die attach film (DAF), or the like. The adhesive 128 may be applied to back-sides of the integrated circuit dies 50A and 50B or may be applied over the surface of the carrier substrate 102. For example, the adhesive 128 may be applied to the back-sides of the integrated circuit dies 50A and 50B before the singulation process 80 (see FIG. 5) is performed.

Figure 10:
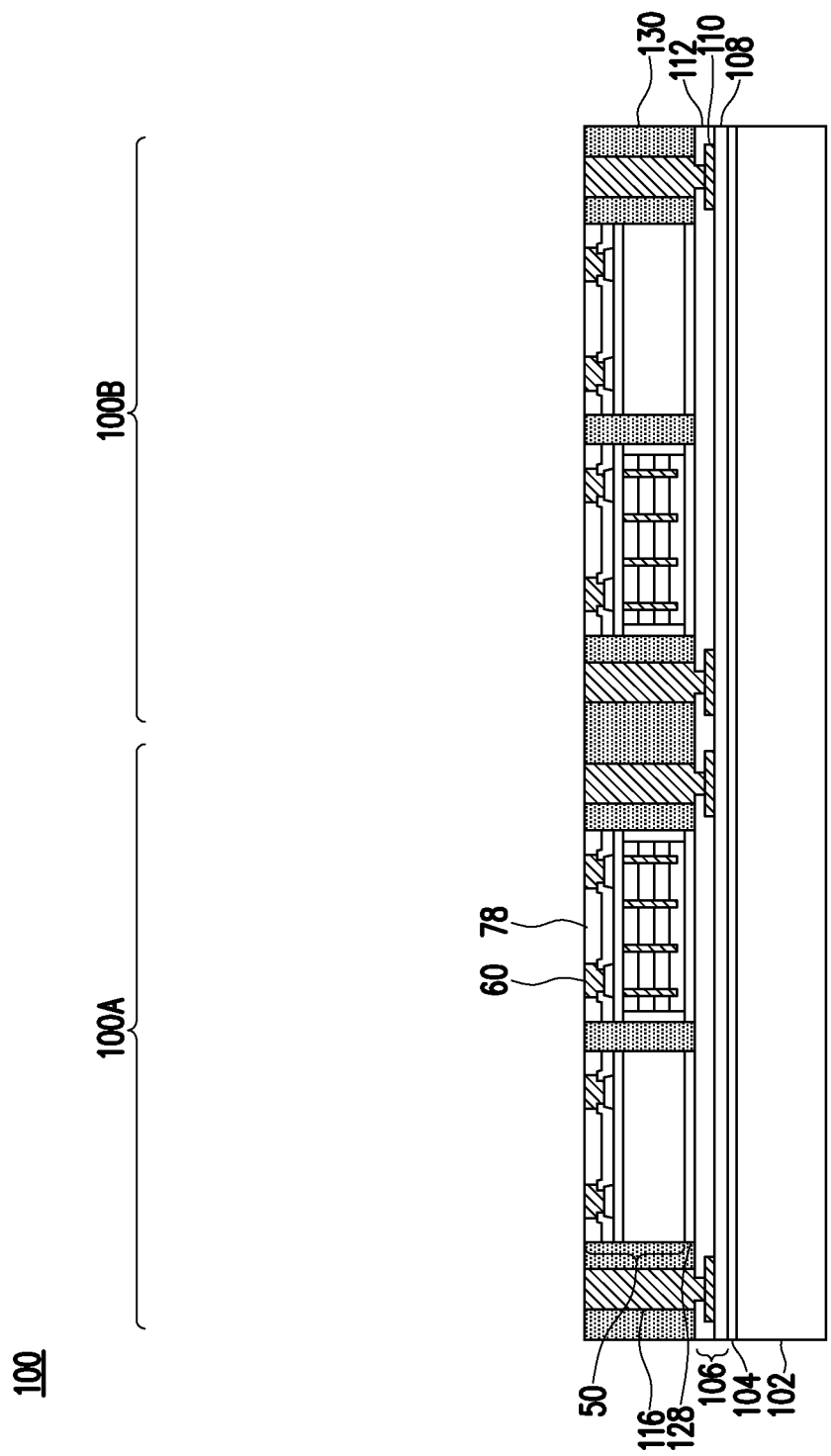

In FIG. 10, an encapsulant 130 is formed on and around the various components. After formation, the encapsulant 130 encapsulates the through vias 116 and integrated circuit dies 50. The encapsulant 130 may be a molding compound, epoxy, or the like. The encapsulant 130 may be applied by compression molding, transfer molding, or the like, and may be formed over the carrier substrate 102 such that the through vias 116 and/or the integrated circuit dies 50 are buried or covered. The encapsulant 130 is further formed in gap regions between the integrated circuit dies 50, if present. The encapsulant 130 may be applied in liquid or semi-liquid form and then subsequently cured.

A planarization process may be performed on the encapsulant 130 to expose the through vias 116 and the die connectors 60. The planarization process may remove material of the through vias 116, dielectric layer 78, and/or die connectors 60 until the die connectors 60 and through vias 116 are exposed. Top surfaces of the through vias 116, die connectors 60, dielectric layer 78, and encapsulant 130 are coplanar after the planarization process. The planarization process may be, for example, a chemical-mechanical polish (CMP), a grinding process, or the like. During the planarization process, the top surfaces of the connectors 60 are polished, which may remove the second conductive material layers 68B and/or third conductive material layers 68C (see FIG. 3F). Removing the reflowable connectors 70 with the etching process 74 before performing the planarization process may help reduce the amount of solder residue in the dielectric layer 78.

Figure 11:
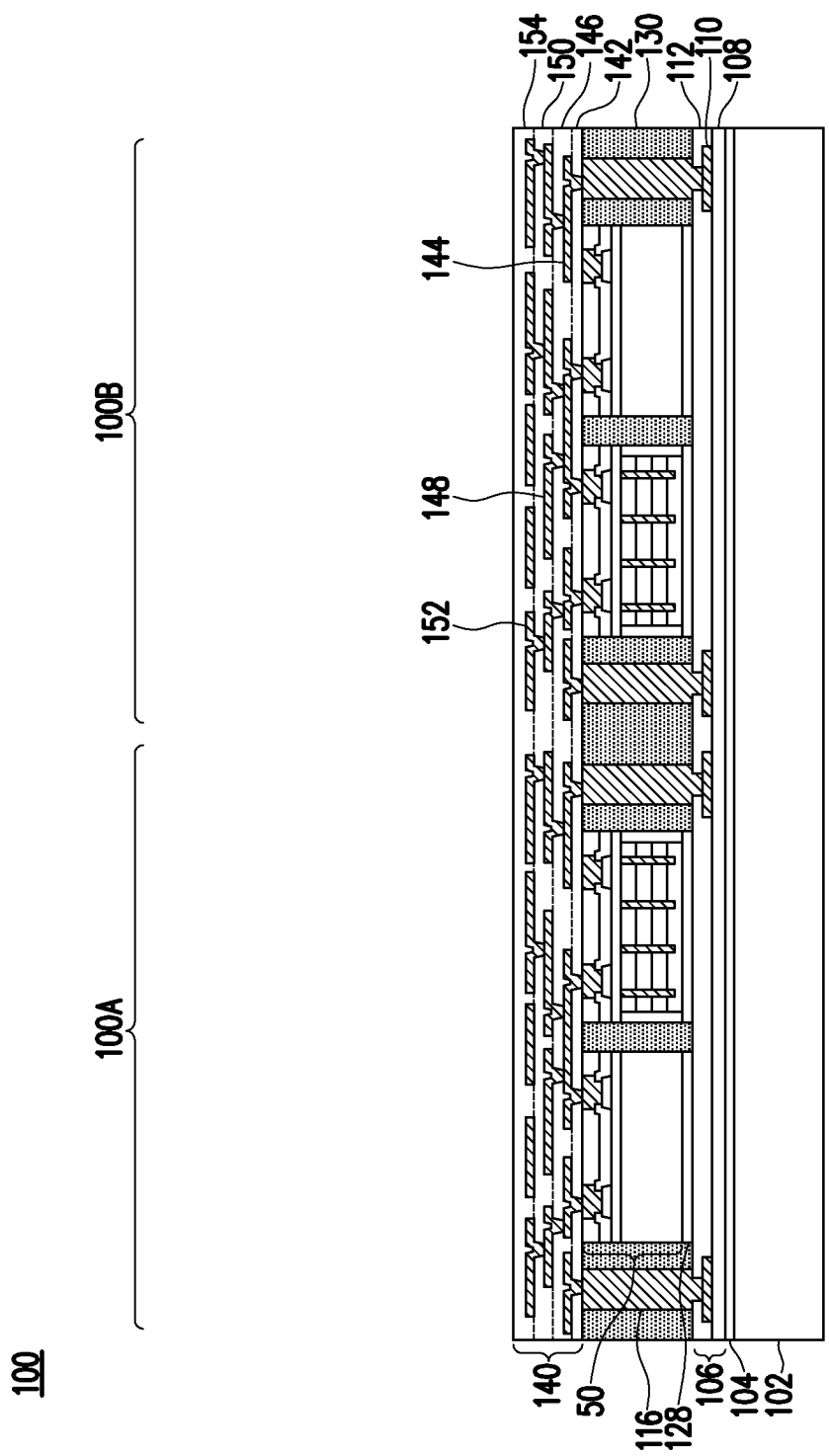

In FIG. 11, a front-side redistribution structure 140 is formed over the encapsulant 130, through vias 116, and integrated circuit dies 50. The front-side redistribution structure 140 includes dielectric layers 142, 146, 150, and 154; and metallization patterns 144, 148, and 152. The metallization patterns may also be referred to as redistribution layers or redistribution lines. The front-side redistribution structure 140 is shown as an example having three layers of metallization patterns. More or fewer dielectric layers and metallization patterns may be formed in the front-side redistribution structure 140. If fewer dielectric layers and metallization patterns are to be formed, steps and process discussed below may be omitted. If more dielectric layers and metallization patterns are to be formed, steps and processes discussed below may be repeated.

As an example to form the front-side redistribution structure 140, the dielectric layer 142 can be deposited on the encapsulant 130, through vias 116, and die connectors 60. In some embodiments, the dielectric layer 142 is formed of a photo-sensitive material such as PBO, polyimide, BCB, or the like, which may be patterned using a lithography mask. The dielectric layer 142 may be formed by spin coating, lamination, CVD, the like, or a combination thereof. The dielectric layer 142 is then patterned. The patterning forms openings exposing portions of the through vias 116 and the die connectors 60. The patterning may be by an acceptable process, such as by exposing the dielectric layer 142 to light when the dielectric layer 142 is a photo-sensitive material or by etching using, for example, an anisotropic etch. If the dielectric layer 142 is a photo-sensitive material, the dielectric layer 142 can be developed after the exposure.

The metallization pattern 144 is then formed. The metallization pattern 144 includes line portions (also referred to as conductive lines) on and extending along the major surface of the dielectric layer 142. The metallization pattern 144 further includes via portions (also referred to as conductive vias) extending through the dielectric layer 142 to physically and electrically couple the through vias 116 and the integrated circuit dies 50. As an example to form the metallization pattern 144, a seed layer is formed over the dielectric layer 142 and in the openings extending through the dielectric layer 142. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 144. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 144. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The dielectric layer 146 is then deposited on the metallization pattern 144 and dielectric layer 142. The dielectric layer 146 may be formed in a manner similar to the dielectric layer 142, and may be formed of a similar material as the dielectric layer 142.

The metallization pattern 148 is then formed. The metallization pattern 148 includes line portions on and extending along the major surface of the dielectric layer 146. The metallization pattern 148 further includes via portions extending through the dielectric layer 146 to physically and electrically couple the metallization pattern 144. The metallization pattern 148 may be formed in a similar manner and of a similar material as the metallization pattern 144. In some embodiments, the metallization pattern 148 has a different size than the metallization pattern 144. For example, the conductive lines and/or vias of the metallization pattern 148 may be wider or thicker than the conductive lines and/or vias of the metallization pattern 144. Further, the metallization pattern 148 may be formed to a greater pitch than the metallization pattern 144.

The dielectric layer 150 is then deposited on the metallization pattern 148 and dielectric layer 146. The dielectric layer 150 may be formed in a manner similar to the dielectric layer 142, and may be formed of a similar material as the dielectric layer 142.

The metallization pattern 152 is then formed. The metallization pattern 152 includes line portions on and extending along the major surface of the dielectric layer 150. The metallization pattern 152 further includes via portions extending through the dielectric layer 150 to physically and electrically couple the metallization pattern 148. The metallization pattern 152 may be formed in a similar manner and of a similar material as the metallization pattern 144. The metallization pattern 152 is the topmost metallization pattern of the front-side redistribution structure 140. As such, all of the intermediate metallization patterns of the front-side redistribution structure 140 (e.g., the metallization patterns 144 and 148) are disposed between the metallization pattern 152 and the integrated circuit dies 50. In some embodiments, the metallization pattern 152 has a different size than the metallization patterns 144 and 148. For example, the conductive lines and/or vias of the metallization pattern 152 may be wider or thicker than the conductive lines and/or vias of the metallization patterns 144 and 148. Further, the metallization pattern 152 may be formed to a greater pitch than the metallization pattern 148.

The dielectric layer 154 is then deposited on the metallization pattern 152 and dielectric layer 150. The dielectric layer 154 may be formed in a manner similar to the dielectric layer 142, and may be formed of a similar material as the dielectric layer 142.

Figure 12:
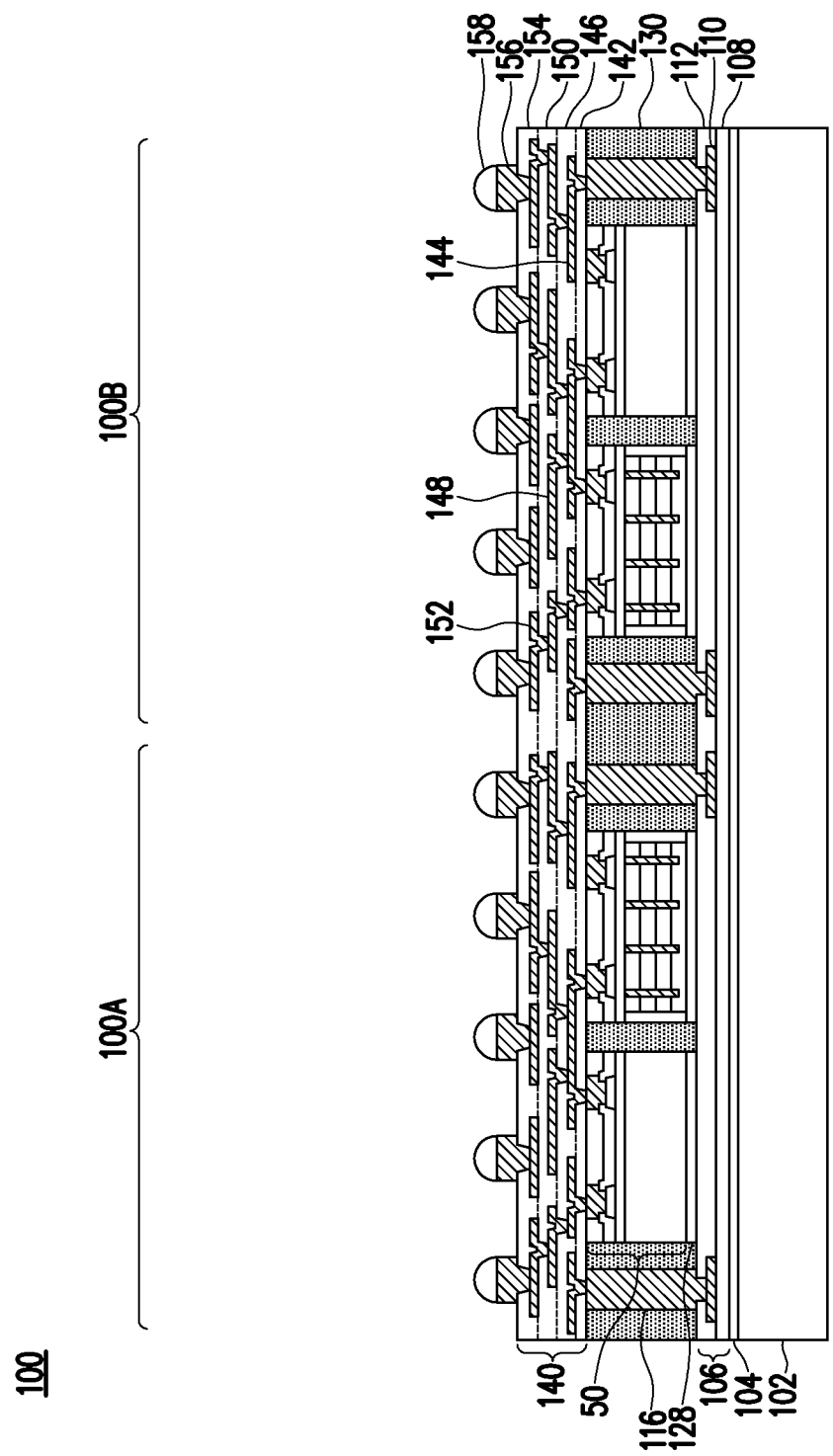

In FIG. 12, under-bump metallurgies (UBMs) 156 are formed for external connection to the front-side redistribution structure 140. The UBMs 156 have bump portions on and extending along the major surface of the dielectric layer 154, and have via portions extending through the dielectric layer 154 to physically and electrically couple the metallization pattern 152. As a result, the UBMs 156 are electrically coupled to the through vias 116 and the integrated circuit dies 50. The UBMs 156 may be formed of the same material as the metallization pattern 144. In some embodiments, the UBMs 156 has a different size than the metallization patterns 144, 148, and 152.

Next, conductive connectors 158 are formed on the UBMs 156. The conductive connectors 158 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 158 may include a conductive material such as solder, copper, aluminum, gold, nickel, silver, palladium, tin, the like, or a combination thereof. In some embodiments, the conductive connectors 158 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 158 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 13:
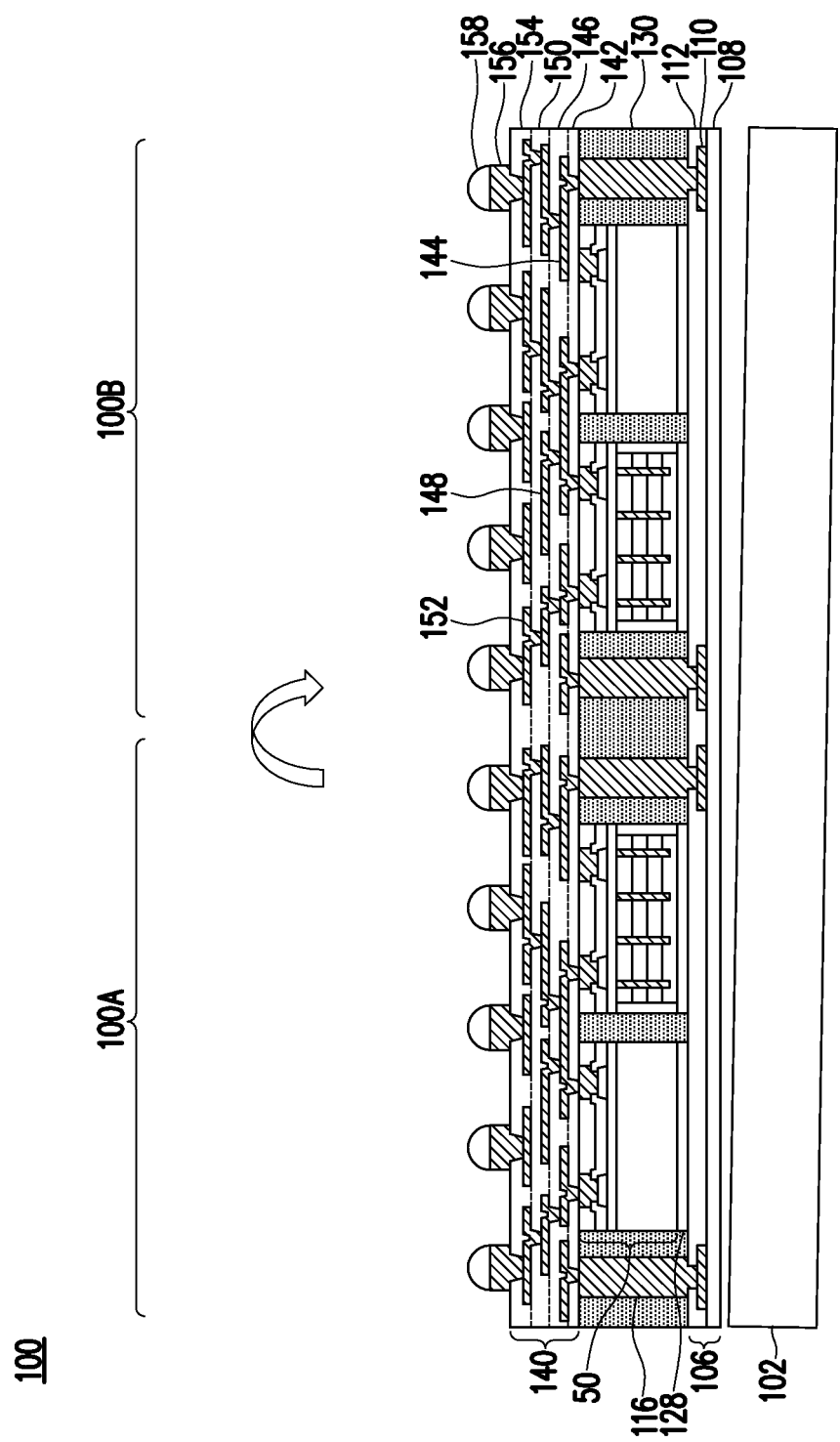

In FIG. 13, a carrier substrate de-bonding is performed to detach (or "de-bond") the carrier substrate 102 from the back-side redistribution structure 106, e.g., the dielectric layer 108. In accordance with some embodiments, the de-bonding includes projecting a light such as a laser light or an UV light on the release layer 104 so that the release layer 104 decomposes under the heat of the light and the carrier substrate 102 can be removed. The structure is then flipped over and placed on a tape.

Figure 14:
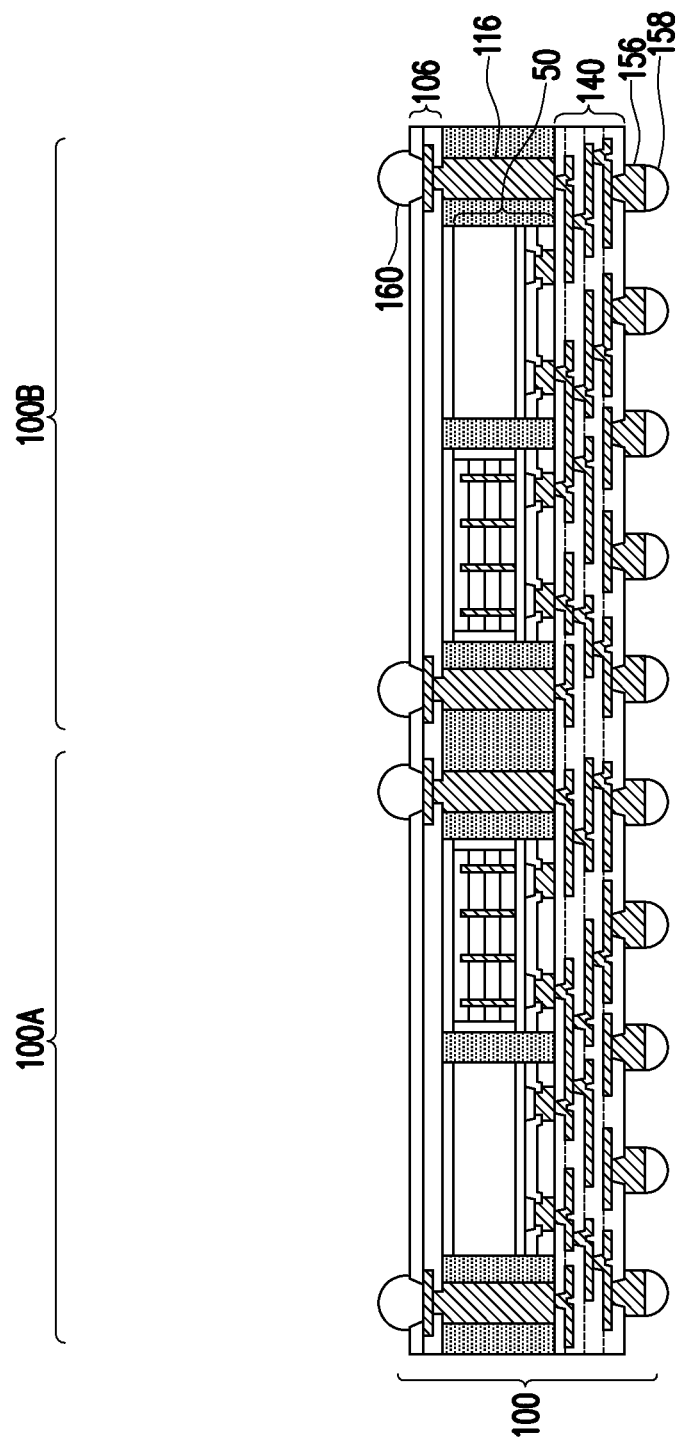

In FIG. 14, conductive connectors 160 are formed extending through the dielectric layer 108 to contact the metallization pattern 110. Openings are formed through the dielectric layer 108 to expose portions of the metallization pattern 110. The openings may be formed, for example, using laser drilling, etching, or the like. The conductive connectors 160 are formed in the openings. In some embodiments, the conductive connectors 160 comprise flux and are formed in a flux dipping process. In some embodiments, the conductive connectors 160 comprise a conductive paste such as solder paste, silver paste, or the like, and are dispensed in a printing process. In some embodiments, the conductive connectors 160 are formed in a manner similar to the conductive connectors 158, and may be formed of a similar material as the conductive connectors 158.

Figure 15:
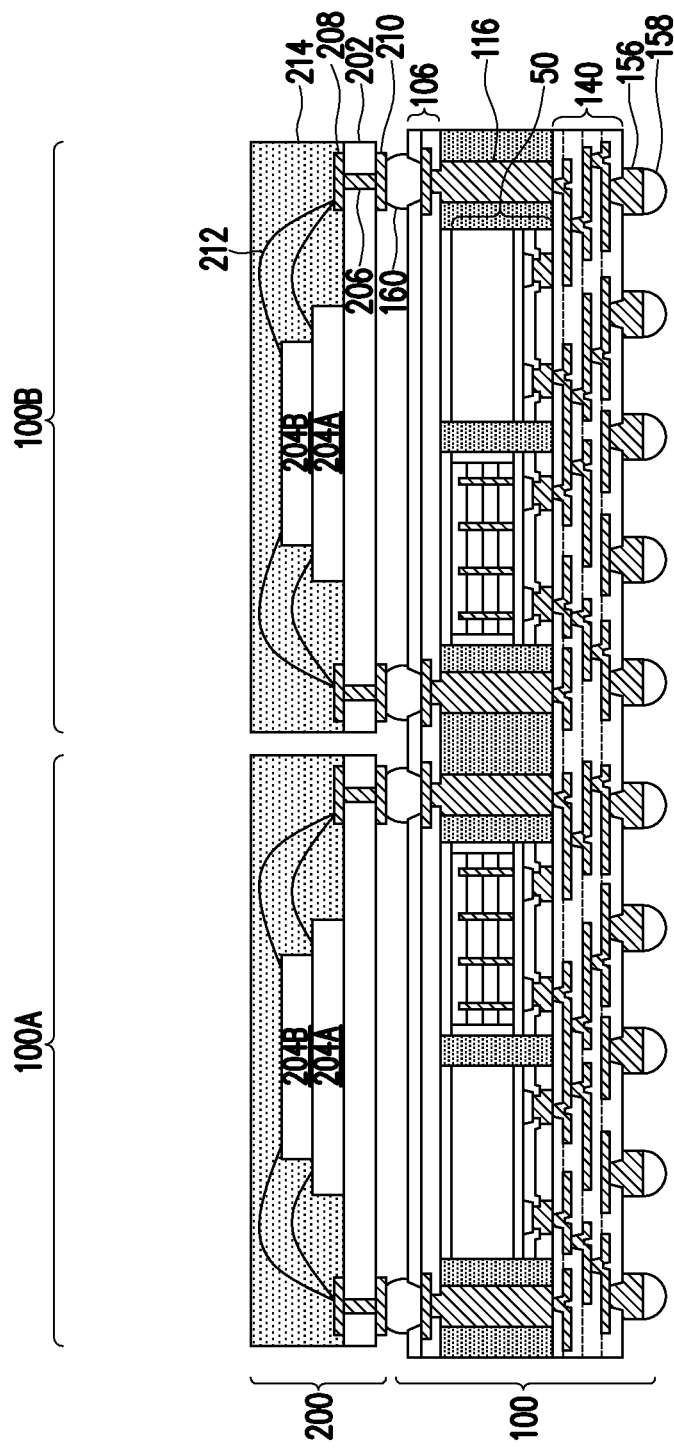
FIGS. 15 and 16 illustrate the formation and implementation of device stacks, in accordance with some embodiments.
Figure 16:
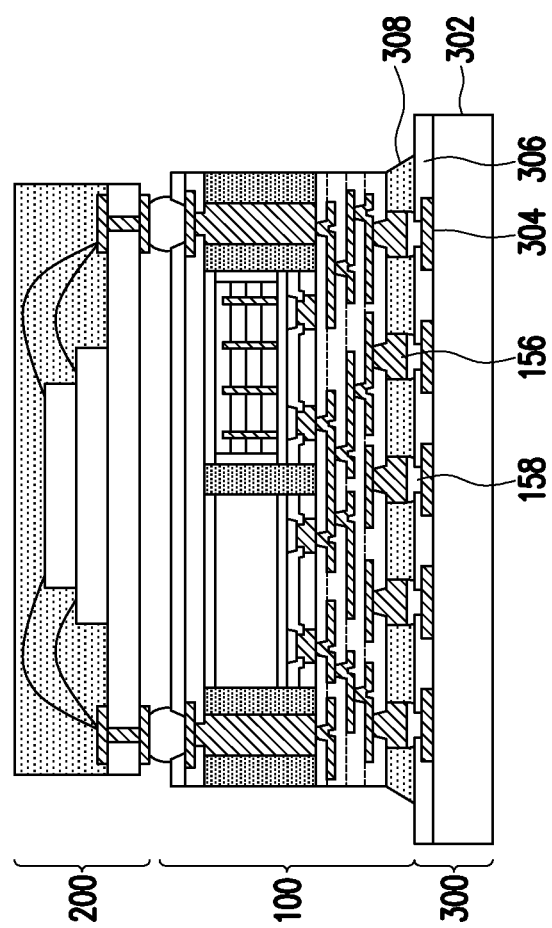

FIGS. 15 and 16 illustrate formation and implementation of device stacks, in accordance with some embodiments. The device stacks are formed from the integrated circuit packages formed in the first package component 100. The device stacks may also be referred to as package-on-package (PoP) structures.

In FIG. 15, second package components 200 are coupled to the first package component 100. One of the second package components 200 are coupled in each of the package regions 100A and 100B to form an integrated circuit device stack in each region of the first package component 100.

The second package components 200 include a substrate 202 and one or more dies coupled to the substrate 202. In the illustrated embodiment, the dies include stacked dies 204A and 204B. In some embodiments, the dies (or die stacks) may be disposed side-by-side coupled to a same surface of the substrate 202. The substrate 202 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 202 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 202 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 202.

The substrate 202 may include active and passive devices (not shown). A wide variety of devices such as transistors, capacitors, resistors, combinations of these, and the like may be used to generate the structural and functional requirements of the design for the second package components 200. The devices may be formed using any suitable methods.

The substrate 202 may also include metallization layers (not shown) and conductive vias 206. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 202 is substantially free of active and passive devices.

The substrate 202 may have bond pads 208 on a first side of the substrate 202 to couple to the stacked dies 204A and 204B, and bond pads 210 on a second side of the substrate 202, the second side being opposite the first side of the substrate 202, to couple to the conductive connectors 160. In some embodiments, the bond pads 208 and 210 are formed by forming recesses into dielectric layers on the first and second sides of the substrate 202. The recesses may be formed to allow the bond pads 208 and 210 to be embedded into the dielectric layers. In other embodiments, the recesses are omitted as the bond pads 208 and 210 may be formed on the dielectric layer. In some embodiments, the bond pads 208 and 210 include a thin seed layer made of copper, titanium, nickel, gold, palladium, the like, or a combination thereof. The conductive material of the bond pads 208 and 210 may be deposited over the thin seed layer. The conductive material may be formed by an electro-chemical plating process, an electroless plating process, CVD, atomic layer deposition (ALD), PVD, the like, or a combination thereof. In an embodiment, the conductive material of the bond pads 208 and 210 is copper, tungsten, aluminum, silver, gold, the like, or a combination thereof.

In an embodiment, the bond pads 208 and 210 are UBMs that include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the bond pads 208 and 210. Any suitable materials or layers of material that may be used for the bond pads 208 and 210 are fully intended to be included within the scope of the current application. In some embodiments, the conductive vias 206 extend through the substrate 202 and couple at least one of the bond pads 208 to at least one of the bond pads 210.

In the illustrated embodiment, the stacked dies 204A and 204B are coupled to the substrate 202 by wire bonds 212, although other connections may be used, such as conductive bumps. In an embodiment, the stacked dies 204A and 204B are stacked memory dies. For example, the stacked dies 204A and 204B may be memory dies such as low-power (LP) double data rate (DDR) memory modules, such as LPDDR1, LPDDR2, LPDDR3, LPDDR4, or the like memory modules.

The stacked dies 204A and 204B and the wire bonds 212 may be encapsulated by a molding material 214. The molding material 214 may be molded on the stacked dies 204A and 204B and the wire bonds 212, for example, using compression molding. In some embodiments, the molding material 214 is a molding compound, a polymer, an epoxy, silicon oxide filler material, the like, or a combination thereof. A curing process may be performed to cure the molding material 214; the curing process may be a thermal curing, a UV curing, the like, or a combination thereof.

In some embodiments, the stacked dies 204A and 204B and the wire bonds 212 are buried in the molding material 214, and after the curing of the molding material 214, a planarization step, such as a grinding, is performed to remove excess portions of the molding material 214 and provide a substantially planar surface for the second package components 200.

After the second package components 200 are formed, the second package components 200 are mechanically and electrically bonded to the first package component 100 by way of the conductive connectors 160, the bond pads 208 and 210, and a metallization pattern of the back-side redistribution structure 106. In some embodiments, the stacked dies 204A and 204B may be coupled to the integrated circuit dies 50 through the wire bonds 212, the bond pads 208 and 210, conductive vias 206, the conductive connectors 160, the back-side redistribution structure 106, the through vias 116, and the front-side redistribution structure 140.

In some embodiments, a solder resist is formed on the side of the substrate 202 opposing the stacked dies 204A and 204B. The conductive connectors 160 may be disposed in openings in the solder resist to be electrically and mechanically coupled to conductive features (e.g., the bond pads 210) in the substrate 202. The solder resist may be used to protect areas of the substrate 202 from external damage.

In some embodiments, the conductive connectors 160 have an epoxy flux formed thereon before they are reflowed with at least some of the epoxy portion of the epoxy flux remaining after the second package components 200 are attached to the first package component 100.

In some embodiments, an underfill is formed between the first package component 100 and the second package components 200, surrounding the conductive connectors 160. The underfill may reduce stress and protect the joints resulting from the reflowing of the conductive connectors 160. The underfill may be formed by a capillary flow process after the second package components 200 are attached, or may be formed by a suitable deposition method before the second package components 200 are attached. In embodiments where the epoxy flux is formed, it may act as the underfill.

In FIG. 16, a singulation process is performed by sawing along scribe line regions, e.g., between the first package region 100A and the second package region 100B. The sawing singulates the first package region 100A from the second package region 100B. The resulting, singulated device stack is from one of the first package region 100A or the second package region 100B. In the illustrated embodiment, the singulation process is performed after the second package components 200 are coupled to the first package component 100. In other embodiments, the singulation process is performed before the second package components 200 are coupled to the first package component 100, such as after the carrier substrate 102 is de-bonded and the conductive connectors 160 are formed.

Each integrated circuit package singulated from the first package component 100 is then mounted to a package substrate 300 using the conductive connectors 158. The package substrate 300 includes a substrate core 302 and bond pads 304 over the substrate core 302. The substrate core 302 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 302 may be a SOI substrate. Generally, an SOI substrate includes a layer of a semiconductor material such as epitaxial silicon, germanium, silicon germanium, SOI, SGOI, or combinations thereof. The substrate core 302 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for substrate core 302.

The substrate core 302 may include active and passive devices (not shown). As one of ordinary skill in the art will recognize, a wide variety of devices such as transistors, capacitors, resistors, combinations of these, and the like may be used to generate the structural and functional requirements of the design for the device stack. The devices may be formed using any suitable methods.

The substrate core 302 may also include metallization layers and vias (not shown), with the bond pads 304 being physically and/or electrically coupled to the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate core 302 is substantially free of active and passive devices.

In some embodiments, the conductive connectors 158 are reflowed to attach the first package component 100 to the bond pads 304. The conductive connectors 158 electrically and/or physically couple the package substrate 300, including metallization layers in the substrate core 302, to the first package component 100. In some embodiments, a solder resist 306 is formed on the substrate core 302. The conductive connectors 158 may be disposed in openings in the solder resist 306 to be electrically and mechanically coupled to the bond pads 304. The solder resist 306 may be used to protect areas of the substrate 202 from external damage.

The conductive connectors 158 may have an epoxy flux formed thereon before they are reflowed with at least some of the epoxy portion of the epoxy flux remaining after the first package component 100 is attached to the package substrate 300. This remaining epoxy portion may act as an underfill to reduce stress and protect the joints resulting from the reflowing the conductive connectors 158. In some embodiments, an underfill 308 may be formed between the first package component 100 and the package substrate 300 and surrounding the conductive connectors 158. The underfill 308 may be formed by a capillary flow process after the first package component 100 is attached or may be formed by a suitable deposition method before the first package component 100 is attached.

In some embodiments, passive devices (e.g., surface mount devices (SMDs), not shown) may also be attached to the first package component 100 (e.g., to the UBMs 156) or to the package substrate 300 (e.g., to the bond pads 304). For example, the passive devices may be bonded to a same surface of the first package component 100 or the package substrate 300 as the conductive connectors 158. The passive devices may be attached to the first package component 100 prior to mounting the first package component 100 on the package substrate 300, or may be attached to the package substrate 300 prior to or after mounting the first package component 100 on the package substrate 300.

It should be appreciated that the first package component 100 may be implement in other device stacks. For example, a PoP structure is shown, but the first package component 100 may also be implemented in a Flip Chip Ball Grid Array (FCBGA) package. In such embodiments, the first package component 100 is mounted to a substrate such as the package substrate 300, but the second package component 200 is omitted. Instead, a lid or heat spreader may be attached to the first package component 100. When the second package component 200 is omitted, the back-side redistribution structure 106 and through vias 116 may also be omitted.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 17:
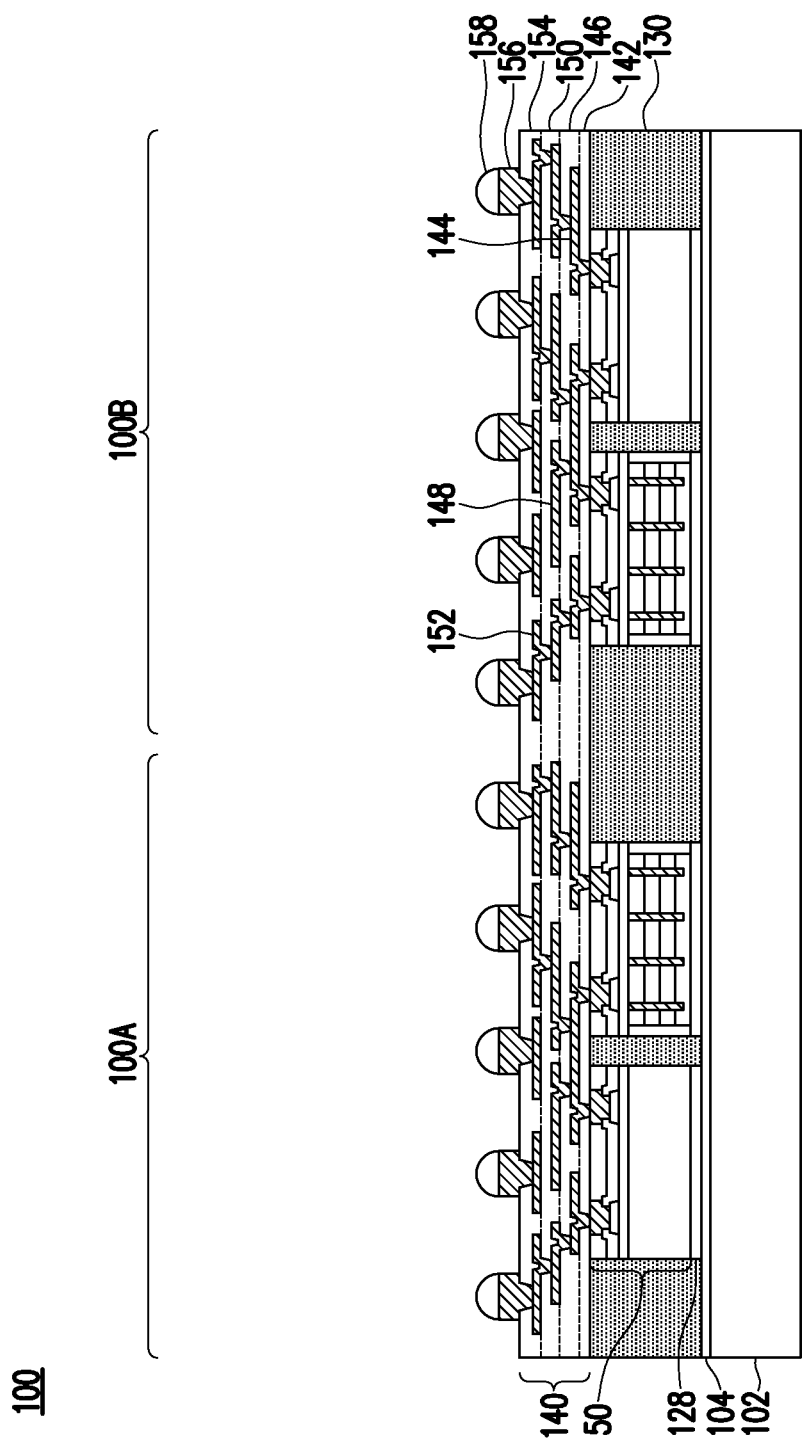
FIG. 17 illustrates a cross-sectional view of a package component, in accordance with some other embodiments.

FIG. 17 illustrates a cross-sectional view of a first package component 100, in accordance with some other embodiments. This embodiment is similar to the embodiment of FIG. 12, but the through vias 116 and back-side redistribution structure 106 are omitted. The first package component 100 of this embodiment may be singulated in subsequent processing and used to implement device stacks, such as those described with respect to FIGS. 15 and 16.

Figure 18:
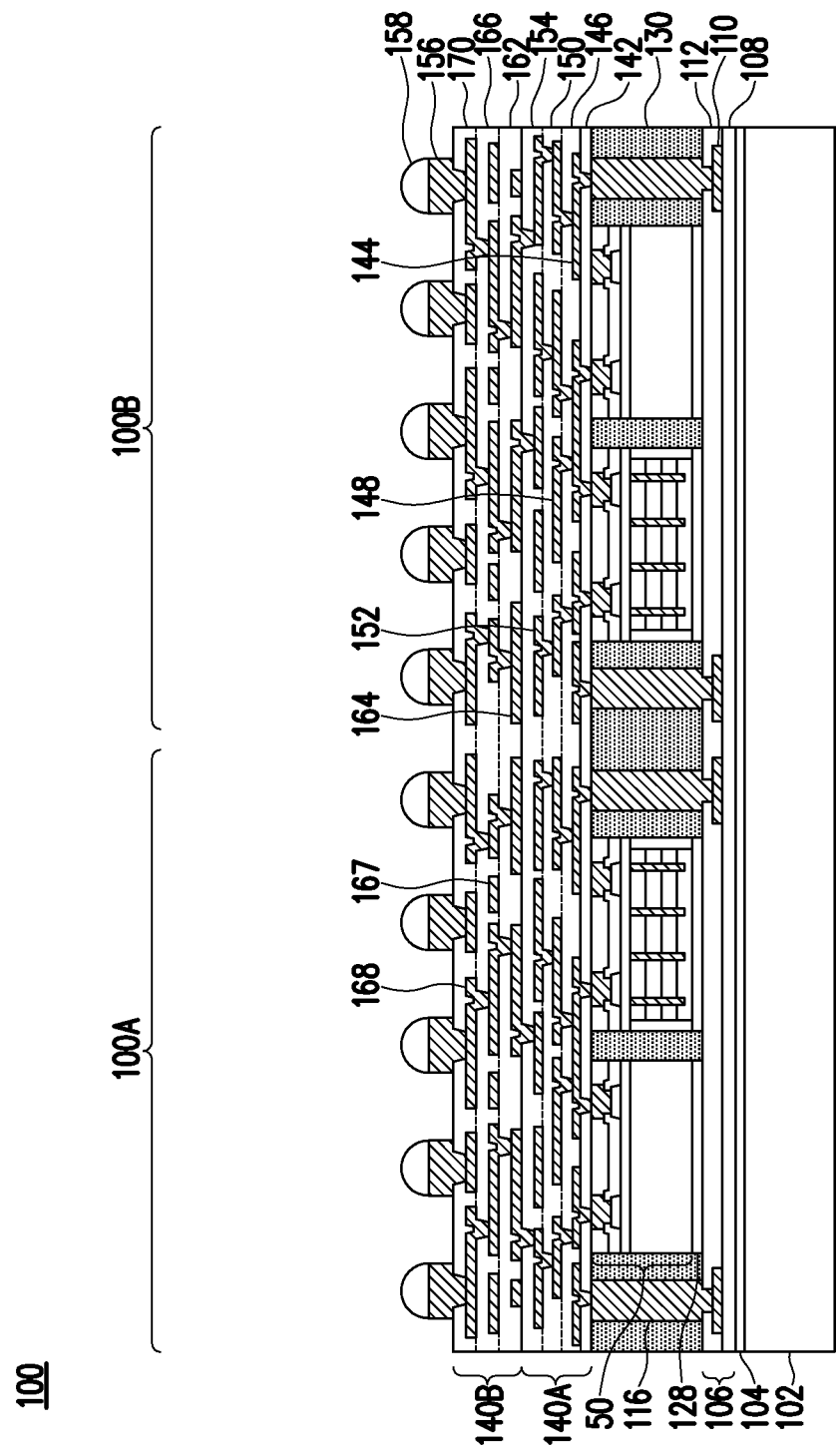
FIG. 18 illustrates a cross-sectional view of a package component, in accordance with some other embodiments.

FIG. 18 illustrates a cross-sectional view of a first package component 100, in accordance with some other embodiments. In this embodiment, the front-side redistribution structure 140 has a fine-featured portion 140A and a coarse-featured portion 140B. The fine-featured portion 140A of the redistribution structure 140 includes the dielectric layers 142, 146, 150, and 154; and the metallization patterns 144, 148, and 152. The coarse-featured portion 140B of the redistribution structure 140 includes dielectric layers 162, 166, and 170; and metallization patterns 164, 167, and 168. The fine-featured portion 140A and coarse-featured portion 140B of the redistribution structure 140 include metallization patterns and dielectric layers of differing sizes. For example, the dielectric layers 142, 146, 150, and 154 are formed to lesser thicknesses than the dielectric layers 162, 166, and 170, and the metallization patterns 144, 148, and 152 are formed to lesser thicknesses than the metallization patterns 164, 167, and 168. The dielectric layers 162, 166, and 170 may be formed in a manner similar to the dielectric layers 142, 146, 150, and 154, and may be formed of a similar material as the dielectric layers 142, 146, 150, and 154. Alternatively, the dielectric layers 162, 166, and 170 may be formed of a different material than the dielectric layers 142, 146, 150, and 154. In some embodiments, the dielectric layers 142, 146, 150, and 154 comprise a photo-sensitive material such as PBO, polyimide, BCB, or the like, and the dielectric layers 162, 166, and 170 comprise a molding compound, epoxy, or the like The first package component 100 of this embodiment may be singulated in subsequent processing and used to implement device stacks, such as those described with respect to FIGS. 15 and 16.

Figure 19:
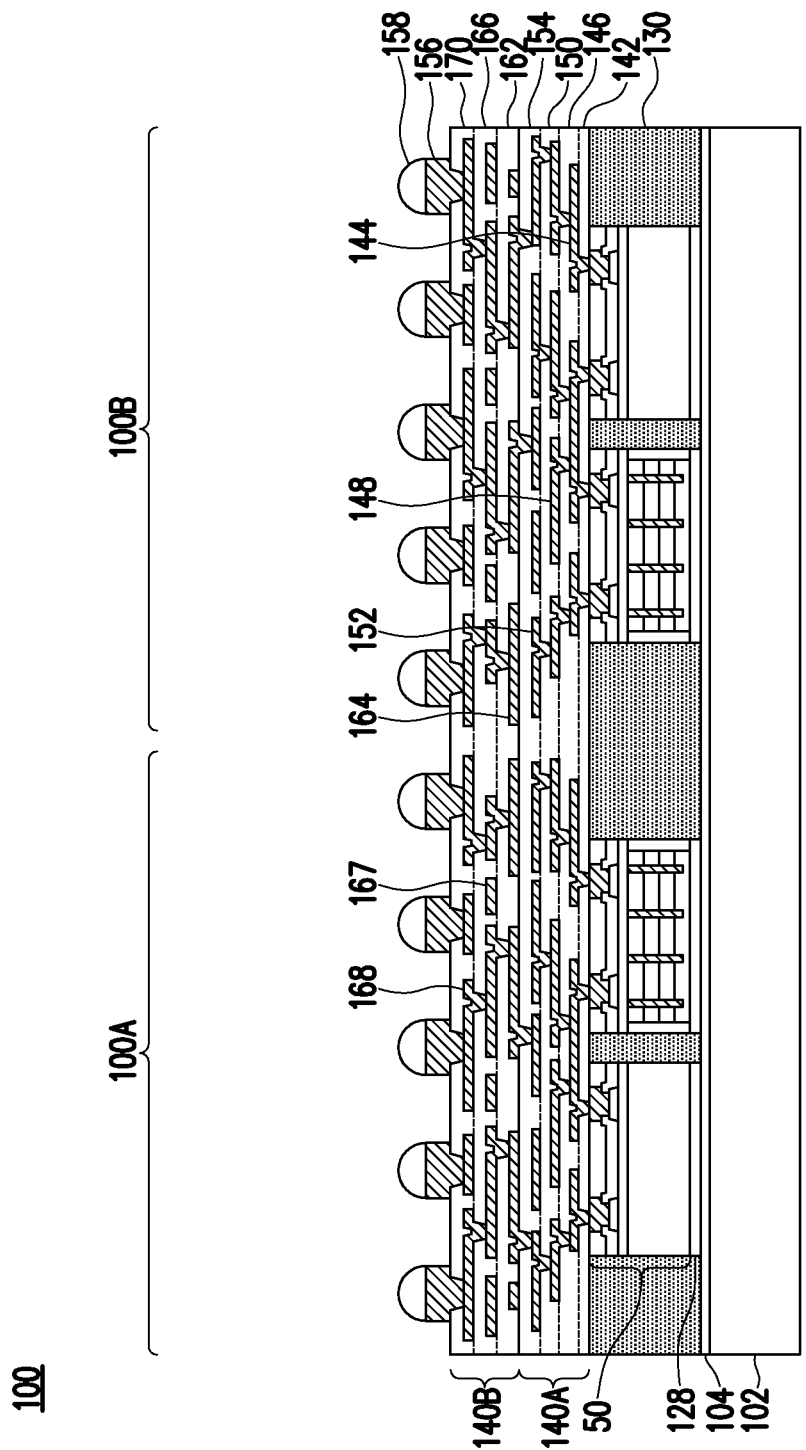
FIG. 19 illustrates a cross-sectional view of a package component, in accordance with some other embodiments.

FIG. 19 illustrates a cross-sectional view of a first package component 100, in accordance with some other embodiments. This embodiment is similar to the embodiment of FIG. 18, but the through vias 116 and back-side redistribution structure 106 are omitted. The first package component 100 of this embodiment may be singulated in subsequent processing and used to implement device stacks, such as those described with respect to FIGS. 15 and 16.

Figure 20:
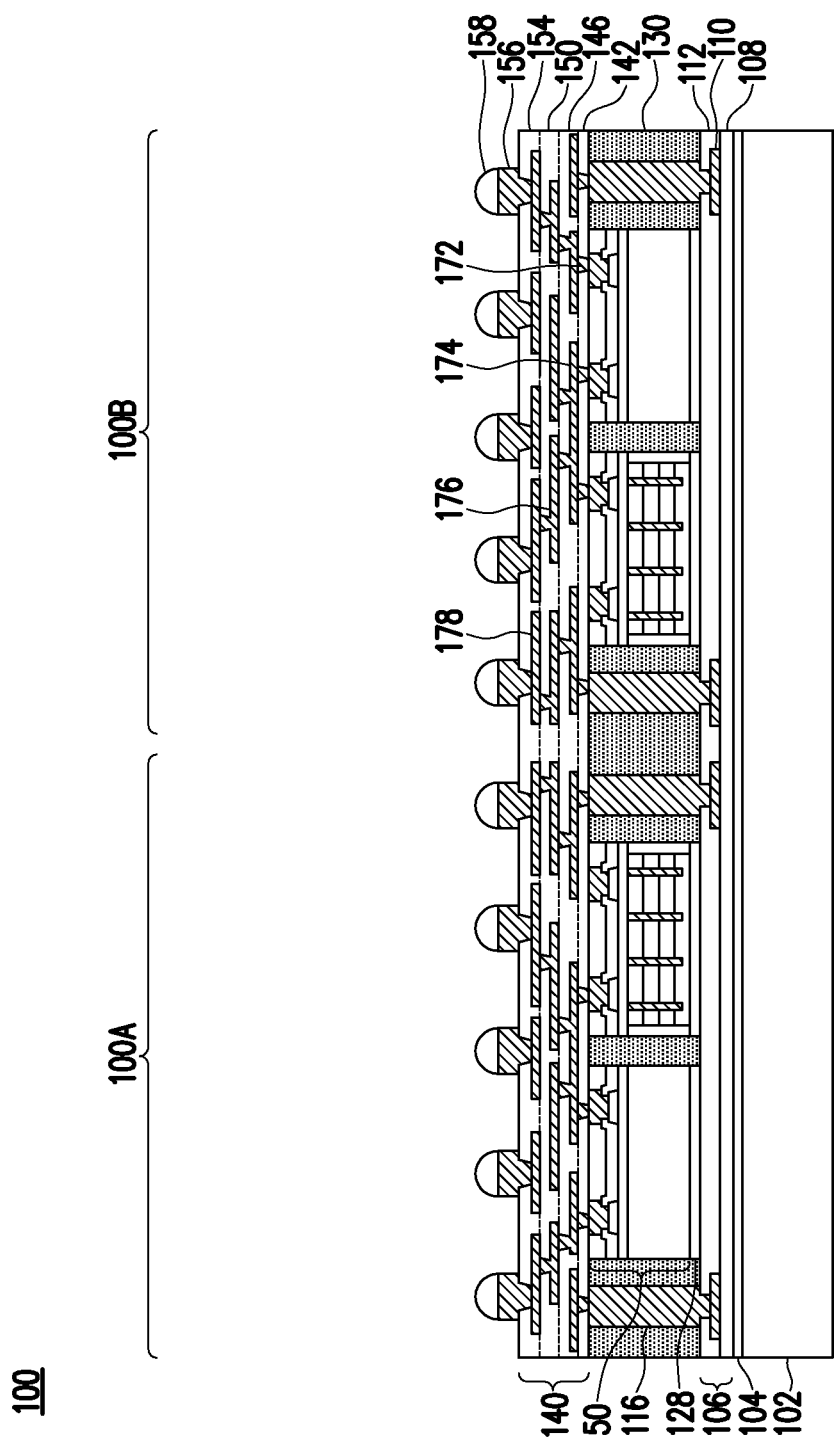
FIG. 20 illustrates a cross-sectional view of a package component, in accordance with some other embodiments.

FIG. 20 illustrates a cross-sectional view of a first package component 100, in accordance with some other embodiments. In this embodiment, the front-side redistribution structure 140 includes metallization patterns 172, 174, 176, and 178, which are formed using a different technique than the metallization patterns 144, 148, and 152. The metallization pattern 172 only includes via portions extending through the dielectric layer 142, and does not include line portions extending along the major surface of the dielectric layer 142. The metallization patterns 174 and 176 include line portions extending along the major surface of the dielectric layers 142 and 146, respectively, and also include via portions extending through the dielectric layers 146 and 150, respectively. Formation of each of the metallization patterns 174 and 176 may include the use of multiple masks. For example, a first mask may be used to plate the line portions, and a second mask may be used to plate the via portions. The metallization pattern 178 only includes line portions extending along the major surface of the dielectric layer 154, and does not include via portions extending through the dielectric layer 150. The UBMs 156 are formed extending through the dielectric layer 154 to couple the metallization pattern 178. The first package component 100 of this embodiment may be singulated in subsequent processing and used to implement device stacks, such as those described with respect to FIGS. 15 and 16.

Figure 21:
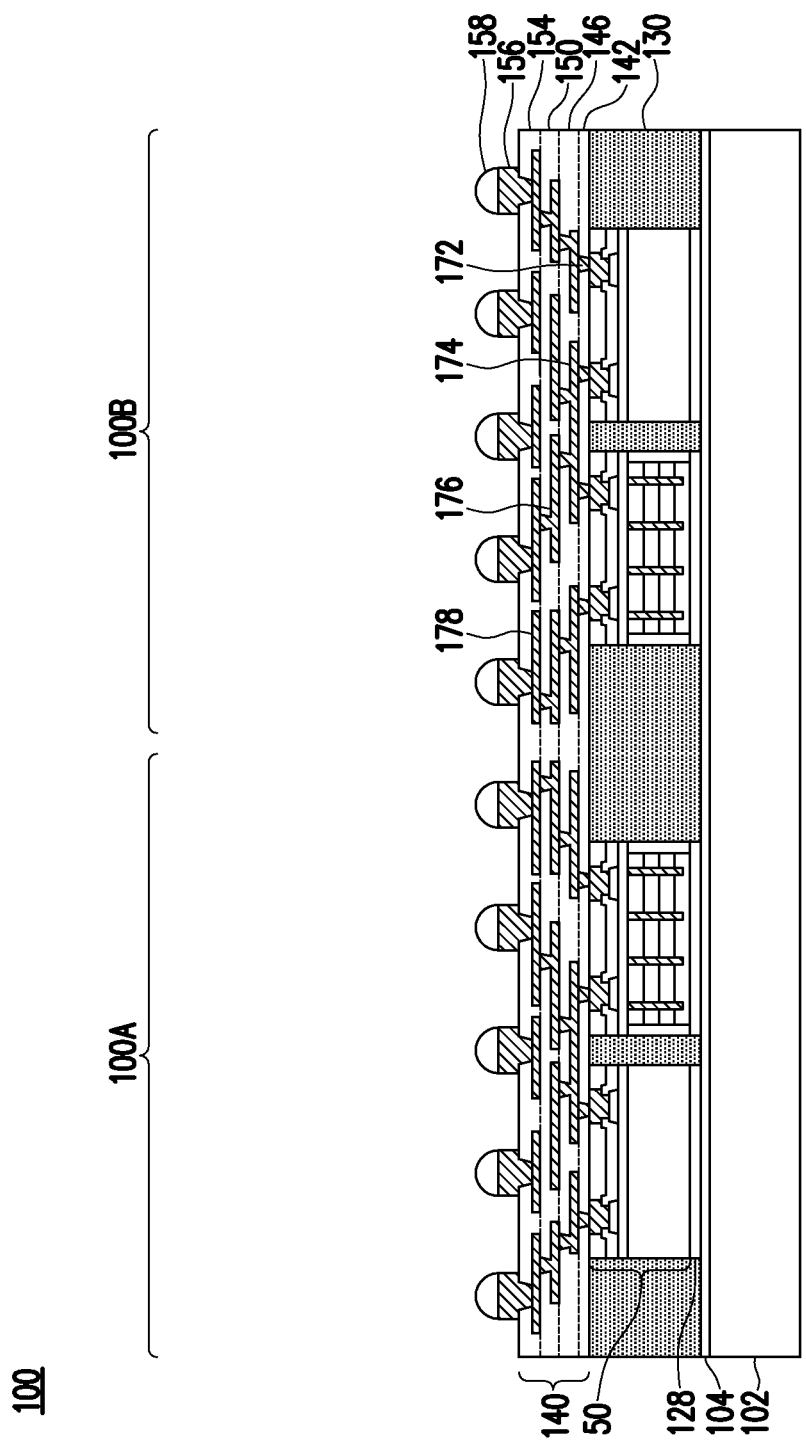
FIG. 21 illustrates a cross-sectional view of a package component, in accordance with some other embodiments.

FIG. 21 illustrates a cross-sectional view of a first package component 100, in accordance with some other embodiments. This embodiment is similar to the embodiment of FIG. 20, but the through vias 116 and back-side redistribution structure 106 are omitted. The first package component 100 of this embodiment may be singulated in subsequent processing and used to implement device stacks, such as those described with respect to FIGS. 15 and 16.

Embodiments may achieve advantages. Removing the reflowable connectors 70 from the die connectors 60 before forming the dielectric layer 78 may prevent solder wetting during the curing process for the dielectric layer 78. Further, removing the reflowable connectors 70 by the etching process 74 instead of by a CMP may help reduce the amount of solder residue in the integrated circuit dies 50.

In an embodiment, a method includes: receiving an integrated circuit die, the integrated circuit die including: a contact pad on a semiconductor substrate; a passivation layer on the contact pad and the semiconductor substrate; a die connector extending through the passivation layer, the die connector being physically and electrically coupled to the contact pad, the die connector including a first conductive material, the first conductive material being a Lewis acid having a first acid hardness/softness index; and a reflowable connector on the die connector, the reflowable connector including a second conductive material, the second conductive material being a Lewis acid having a second acid hardness/softness index; and etching the reflowable connector and the die connector with an etching solution including a protective agent for the first conductive material and an etching agent for the second conductive material, the protective agent being an azole, the azole being a Lewis base having a first ligand hardness/softness index, where a product of the first acid hardness/softness index and the first ligand hardness/softness index is positive, and a product of the second acid hardness/softness index and the first ligand hardness/softness index is negative.

In some embodiments of the method, the azole is a five-membered heterocyclic compound containing a plurality of nitrogen atoms. In some embodiments of the method, the five-membered heterocyclic compound is a pirazole compound including methylpyrazole. In some embodiments of the method, the five-membered heterocyclic compound is an imidazole compound including methylimidazole. In some embodiments of the method, the five-membered heterocyclic compound is a triazole compound including benzotriazole. In some embodiments of the method, the five-membered heterocyclic compound is a tetrazole compound including phenyltetrazole or phenyl-mercaptotetrazole. In some embodiments of the method, the five-membered heterocyclic compound is a pentazole compound including pentazole ($HN_5$). In some embodiments of the method, the die connector includes: a first conductive layer including the first conductive material; and a second conductive layer on the first conductive layer, the second conductive layer including a third conductive material, the third conductive material being a Lewis acid having a third acid hardness/softness index, where a product of the third acid hardness/softness index and the first ligand hardness/softness index is negative, where the etching the reflowable connector reduces a first width of the first conductive layer by an amount in a range of 0.05% to 30%, and where the etching the reflowable connector does not reduce a second width of the second conductive layer. In some embodiments, the method further includes: before etching the reflowable connector and the die connector, testing the integrated circuit die. In some embodiments, the method further includes: after the etching the reflowable connector and the die connector, depositing a dielectric layer on the die connector and the passivation layer.

In an embodiment, a method includes: forming a contact pad on a semiconductor substrate; depositing a passivation layer on the contact pad and the semiconductor substrate; patterning an opening in the passivation layer exposing the contact pad; plating a die connector in the opening and on the contact pad, the die connector including a first conductive material; reflowing a reflowable connector on the die connector; and etching the reflowable connector and the die connector with an etching solution to remove the reflowable connector, the etching solution including an etching agent and a protective agent, the protective agent being a five-membered heterocyclic compound containing a plurality of active sites for bonding to the first conductive material.

In some embodiments of the method, etching the reflowable connector and the die connector includes immersing the reflowable connector and the die connector in a bath of the etching solution. In some embodiments of the method, etching the reflowable connector and the die connector includes spraying the etching solution on the reflowable connector and the die connector. In some embodiments of the method, the spraying the etching solution includes spinning the semiconductor substrate at a speed in a range of 100 RPM to 3000 RPM while flowing the etching solution over the semiconductor substrate at a flow rate in a range of 0.2 L/min to 2 L/min. In some embodiments of the method, etching the reflowable connector and the die connector includes etching the reflowable connector and the die connector at a temperature in a range of 5° C. to 50° C. for a duration in a range of 0.1 minutes to 120 minutes. In some embodiments of the method, the etching solution includes the protective agent at a concentration in a range of 0.0001% to 2%, the etching agent at a concentration in a range of 0.1% to 20%, and a solvent in a range of 0.5% to 50%. In some embodiments of the method, the etching agent is iron(III) or copper(II), and the solvent is nitric acid or sulfuric acid.

In an embodiment, a device includes: a semiconductor substrate; a contact pad on the semiconductor substrate; a passivation layer on the contact pad and the semiconductor substrate; a die connector extending through the passivation layer, the die connector being physically and electrically coupled to the contact pad, the die connector including a first conductive material, the first conductive material being a Lewis acid having a first acid hardness/softness index; a dielectric layer on the die connector and the passivation layer; and a protective layer disposed between the dielectric layer and the die connector, the protective layer surrounding the die connector, the protective layer including a coordination complex of the first conductive material and an azole, the azole being a Lewis base having a first ligand hardness/softness index, where a product of the first acid hardness/softness index and the first ligand hardness/softness index is positive.

In some embodiments of the device, the die connector has an outer region that includes a compound of the first conductive material and the coordination complex, and an inner region that is free of the coordination complex. In some embodiments of the device, the protective layer has a thickness in a range of 1 Å to 100 Å.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   receiving an integrated circuit die, the integrated circuit die comprising:
   a contact pad on a semiconductor substrate;
   a passivation layer on the contact pad and the semiconductor substrate;
   a die connector extending through the passivation layer, the die connector being physically and electrically coupled to the contact pad, the die connector comprising a first conductive material, the first conductive material being a Lewis acid having a first acid hardness/softness index; and
   a reflowable connector on the die connector, the reflowable connector comprising a second conductive material, the second conductive material being a Lewis acid having a second acid hardness/softness index; and
   etching the reflowable connector and the die connector with an etching solution comprising a protective agent for the first conductive material and an etching agent for the second conductive material, the protective agent being an azole, the azole being a Lewis base having a first ligand hardness/softness index,
   wherein a product of the first acid hardness/softness index and the first ligand hardness/softness index is positive, and a product of the second acid hardness/softness index and the first ligand hardness/softness index is negative.

2. The method of claim 1, wherein the azole is a five-membered heterocyclic compound containing a plurality of nitrogen atoms.

3. The method of claim 2, wherein the five-membered heterocyclic compound is a pirazole compound comprising methylpyrazole.

4. The method of claim 2, wherein the five-membered heterocyclic compound is an imidazole compound comprising methylimidazole.

5. The method of claim 2, wherein the five-membered heterocyclic compound is a triazole compound comprising benzotriazole.

6. The method of claim 2, wherein the five-membered heterocyclic compound is a tetrazole compound comprising phenyltetrazole or phenyl-mercaptotetrazole.

7. The method of claim 2, wherein the five-membered heterocyclic compound is a pentazole compound comprising pentazole ($HN_5$).

8. The method of claim 1, wherein the die connector comprises:
   a first conductive layer comprising the first conductive material; and
   a second conductive layer on the first conductive layer, the second conductive layer comprising a third conductive material, the third conductive material being a Lewis acid having a third acid hardness/softness index,
   wherein a product of the third acid hardness/softness index and the first ligand hardness/softness index is negative,
   wherein the etching the reflowable connector reduces a first width of the first conductive layer by an amount in a range of 0.05% to 30%, and
   wherein the etching the reflowable connector does not reduce a second width of the second conductive layer.

9. The method of claim 1 further comprising:
   before etching the reflowable connector and the die connector, testing the integrated circuit die.

10. The method of claim 1 further comprising:
    after the etching the reflowable connector and the die connector, depositing a dielectric layer on the die connector and the passivation layer.

11. A method comprising:
    forming a contact pad on a semiconductor substrate;
    depositing a passivation layer on the contact pad and the semiconductor substrate;
    patterning an opening in the passivation layer exposing the contact pad;
    plating a die connector in the opening and on the contact pad, the die connector comprising a first conductive material;
    reflowing a reflowable connector on the die connector; and
    etching the reflowable connector and the die connector with an etching solution to remove the reflowable connector, the etching solution comprising an etching agent and a protective agent, the protective agent being a five-membered heterocyclic compound containing a plurality of active sites for bonding to the first conductive material.

12. The method of claim 11, wherein etching the reflowable connector and the die connector comprises immersing the reflowable connector and the die connector in a bath of the etching solution.

13. The method of claim 11, wherein etching the reflowable connector and the die connector comprises spraying the etching solution on the reflowable connector and the die connector.

14. The method of claim 13, wherein the spraying the etching solution comprises spinning the semiconductor substrate at a speed in a range of 100 RPM to 3000 RPM while flowing the etching solution over the semiconductor substrate at a flow rate in a range of 0.2 L/min to 2 L/min.

15. The method of claim 11, wherein etching the reflowable connector and the die connector comprises etching the reflowable connector and the die connector at a temperature in a range of 5° C. to 50° C. for a duration in a range of 0.1 minutes to 120 minutes.

16. The method of claim 11, wherein the etching solution comprises the protective agent at a concentration in a range of 0.0001% to 2%, the etching agent at a concentration in a range of 0.1% to 20%, and a solvent in a range of 0.5% to 50%.

17. The method of claim 16, wherein the etching agent is iron(III) or copper(II), and the solvent is nitric acid or sulfuric acid.

18. A device comprising:
a semiconductor substrate;
a contact pad on the semiconductor substrate;
a passivation layer on the contact pad and the semiconductor substrate;
a die connector extending through the passivation layer, the die connector being physically and electrically coupled to the contact pad, the die connector comprising a first conductive material, the first conductive material being a Lewis acid having a first acid hardness/softness index;
a dielectric layer on the die connector and the passivation layer; and
a protective layer disposed between the dielectric layer and the die connector, the protective layer surrounding the die connector, the protective layer comprising a coordination complex of the first conductive material and an azole, the azole being a Lewis base having a first ligand hardness/softness index,
wherein a product of the first acid hardness/softness index and the first ligand hardness/softness index is positive.

19. The device of claim 18, wherein the die connector has an outer region that comprises a compound of the first conductive material and the coordination complex, and an inner region that is free of the coordination complex.

20. The device of claim 18, wherein the protective layer has a thickness in a range of 1 Å to 100 Å.

* * * * *